US009006557B2

(12) United States Patent
LaGrandeur et al.

(10) Patent No.: US 9,006,557 B2
(45) Date of Patent: Apr. 14, 2015

(54) SYSTEMS AND METHODS FOR REDUCING CURRENT AND INCREASING VOLTAGE IN THERMOELECTRIC SYSTEMS

(75) Inventors: John LaGrandeur, Arcadia, CA (US); Eric Poliquin, Arcadia, CA (US); Dmitri Kossakovski, S. Pasadena, CA (US); Vladimir Jovovic, Pasadena, CA (US)

(73) Assignee: Gentherm Incorporated, Azusa, CA (US)

( * ) Notice: Subject to any disclaimer, the term of this patent is extended or adjusted under 35 U.S.C. 154(b) by 177 days.

(21) Appl. No.: 13/489,192

(22) Filed: Jun. 5, 2012

(65) Prior Publication Data

US 2013/0037073 A1 Feb. 14, 2013

Related U.S. Application Data

(60) Provisional application No. 61/493,899, filed on Jun. 6, 2011, provisional application No. 61/493,842, filed on Jun. 6, 2011.

(51) Int. Cl.
*H01L 35/28* (2006.01)
*H01L 35/30* (2006.01)
*H01L 35/32* (2006.01)

(52) U.S. Cl.
CPC ............... *H01L 35/30* (2013.01); *H01L 35/32* (2013.01)

(58) Field of Classification Search
CPC .......... H01L 35/32; H01L 35/00; H01L 35/30
USPC ................................................ 136/200–242
See application file for complete search history.

(56) References Cited

U.S. PATENT DOCUMENTS

| 1,120,781 A | 12/1914 | Altenkirch et al. |
| 2,362,259 A | 11/1944 | Findley |
| 2,363,168 A | 11/1944 | Findley |
| 2,499,901 A | 3/1950 | Brown, Jr. |
| 2,519,241 A | 8/1950 | Findley |

(Continued)

FOREIGN PATENT DOCUMENTS

| CN | 1249067 A | 3/2000 |
| DE | 10 2008 063701 A1 | 6/2010 |

(Continued)

OTHER PUBLICATIONS

Crane, D. T.: "Progress Towards Maximizing the Performance of A thermoelectric Power Generator", ICT '06, 25th, USA, IEEE, Aug. 1, 2006, 11-16I.

(Continued)

*Primary Examiner* — Tamir Ayad
(74) *Attorney, Agent, or Firm* — Knobbe Martens Olson & Bear, LLP

(57) ABSTRACT

A thermoelectric assembly and method are provided. The thermoelectric assembly can extend at least partially around a perimeter of a first fluid conduit. The thermoelectric assembly can include a plurality of thermoelectric sub-assemblies aligned with one another along the perimeter of the first fluid conduit. Each thermoelectric sub-assembly can include a plurality of thermoelectric elements in parallel electrical communication with one another, and at least one shunt a plurality of electrically insulating elements to prevent current flow in a plane perpendicular to the first direction between adjacent thermoelectric sub-assemblies.

9 Claims, 21 Drawing Sheets

(56) References Cited

U.S. PATENT DOCUMENTS

| | | | |
|---|---|---|---|
| 2,944,404 | A | 7/1960 | Fritts |
| 2,992,538 | A | 7/1961 | Siegfried |
| 3,004,393 | A | 10/1961 | Alsing |
| 3,006,979 | A | 10/1961 | Rich |
| 3,019,609 | A | 2/1962 | Pietsch |
| 3,070,645 | A | 12/1962 | Tracht |
| 3,071,495 | A | 1/1963 | Hanlein |
| 3,137,142 | A | 6/1964 | Venema |
| 3,178,895 | A | 4/1965 | Mole et al. |
| 3,196,620 | A | 7/1965 | Elfving et al. |
| 3,197,342 | A | 7/1965 | Neild, Jr. |
| 3,213,630 | A | 10/1965 | Mole |
| 3,391,727 | A | 7/1968 | Topouszian |
| 3,505,728 | A | 4/1970 | Hare et al. |
| 3,522,106 | A | 7/1970 | Debiesse et al. |
| 3,527,621 | A | 9/1970 | Newton |
| 3,554,815 | A | 1/1971 | Osborn |
| 3,599,437 | A | 8/1971 | Panas |
| 3,607,444 | A | 9/1971 | DeBucs |
| 3,626,704 | A | 12/1971 | Coe, Jr. |
| 3,635,037 | A | 1/1972 | Hubert |
| 3,663,307 | A | 5/1972 | Mole |
| 3,681,929 | A | 8/1972 | Schering |
| 3,726,100 | A | 4/1973 | Widakowich |
| 3,817,043 | A | 6/1974 | Zoleta |
| 3,885,126 | A | 5/1975 | Sugiyama et al. |
| 3,958,324 | A | 5/1976 | Alais et al. |
| 3,973,524 | A | 8/1976 | Rubin |
| 4,038,831 | A | 8/1977 | Gaudel et al. |
| 4,047,093 | A | 9/1977 | Levoy |
| 4,055,053 | A | 10/1977 | Elfving |
| 4,056,406 | A | 11/1977 | Markman et al. |
| 4,065,936 | A | 1/1978 | Fenton et al. |
| 4,095,998 | A | 6/1978 | Hanson |
| 4,125,122 | A | 11/1978 | Stachurski |
| 4,281,516 | A | 8/1981 | Berthet et al. |
| 4,297,841 | A | 11/1981 | Cheng |
| 4,297,849 | A | 11/1981 | Buffet |
| 4,386,596 | A | 6/1983 | Tuckey |
| 4,402,188 | A | 9/1983 | Skala |
| 4,420,940 | A | 12/1983 | Buffet |
| 4,448,028 | A | 5/1984 | Chao et al. |
| 4,448,157 | A | 5/1984 | Eckstein et al. |
| 4,494,380 | A | 1/1985 | Cross |
| 4,499,329 | A | 2/1985 | Benicourt et al. |
| 4,531,379 | A | 7/1985 | Diefenthaler, Jr. |
| 4,595,297 | A | 6/1986 | Liu et al. |
| 4,634,803 | A | 1/1987 | Mathiprakasam |
| 4,730,459 | A | 3/1988 | Schlicklin et al. |
| 4,753,682 | A | 6/1988 | Cantoni |
| 4,802,929 | A | 2/1989 | Schock |
| 4,885,087 | A | 12/1989 | Kopf |
| 4,907,060 | A | 3/1990 | Nelson et al. |
| 4,989,626 | A | 2/1991 | Takagi et al. |
| 5,006,178 | A | 4/1991 | Bijvoets |
| 5,038,569 | A | 8/1991 | Shirota et al. |
| 5,092,129 | A | 3/1992 | Bayes et al. |
| 5,171,372 | A | 12/1992 | Recine, Sr. |
| 5,180,293 | A | 1/1993 | Hartl |
| 5,193,347 | A | 3/1993 | Apisdorf |
| 5,228,923 | A | 7/1993 | Hed |
| 5,232,516 | A | 8/1993 | Hed |
| 5,254,178 | A | 10/1993 | Yamada et al. |
| 5,316,078 | A | 5/1994 | Cesaroni |
| 5,385,020 | A | 1/1995 | Gwilliam et al. |
| 5,419,780 | A | 5/1995 | Suski |
| 5,419,980 | A | 5/1995 | Okamoto et al. |
| 5,429,680 | A | 7/1995 | Fuschetti |
| 5,430,322 | A | 7/1995 | Koyanagi et al. |
| 5,431,021 | A | 7/1995 | Gwilliam et al. |
| 5,456,081 | A | 10/1995 | Chrysler et al. |
| 5,497,625 | A | 3/1996 | Manz et al. |
| 5,544,487 | A | 8/1996 | Attey et al. |
| 5,549,153 | A | 8/1996 | Baruschke et al. |
| 5,561,981 | A | 10/1996 | Quisenberry et al. |
| 5,563,368 | A | 10/1996 | Yamaguchi |
| 5,566,774 | A | 10/1996 | Yoshida |
| 5,576,512 | A | 11/1996 | Doke |
| 5,584,183 | A | 12/1996 | Wright et al. |
| 5,592,363 | A | 1/1997 | Atarashi et al. |
| 5,594,609 | A | 1/1997 | Lin |
| 5,682,748 | A | 11/1997 | DeVilbiss et al. |
| 5,705,770 | A | 1/1998 | Ogasawara et al. |
| 5,713,426 | A | 2/1998 | Okamura |
| 5,724,818 | A | 3/1998 | Iwata et al. |
| 5,822,993 | A | 10/1998 | Attey |
| 5,860,472 | A | 1/1999 | Batchelder |
| 5,867,990 | A | 2/1999 | Ghoshal |
| 5,917,144 | A | 6/1999 | Miyake et al. |
| 5,959,341 | A | 9/1999 | Tsuno et al. |
| 5,966,941 | A | 10/1999 | Ghoshal |
| 5,987,890 | A | 11/1999 | Chiu et al. |
| 6,000,225 | A | 12/1999 | Ghoshal |
| 6,028,263 | A | 2/2000 | Kobayashi et al. |
| 6,050,326 | A | 4/2000 | Evans |
| 6,082,445 | A | 7/2000 | Dugan |
| 6,084,172 | A | 7/2000 | Kishi et al. |
| 6,096,966 | A | 8/2000 | Nishimoto et al. |
| 6,127,766 | A | 10/2000 | Roidt |
| 6,213,198 | B1 | 4/2001 | Shikata et al. |
| 6,223,539 | B1 | 5/2001 | Bell |
| 6,226,994 | B1 | 5/2001 | Yamada et al. |
| 6,270,015 | B1 | 8/2001 | Hirota |
| 6,282,907 | B1 | 9/2001 | Ghoshal |
| 6,302,196 | B1 | 10/2001 | Haussmann |
| 6,320,280 | B1 | 11/2001 | Kanesaka |
| 6,334,311 | B1 | 1/2002 | Kim et al. |
| 6,346,668 | B1 | 2/2002 | McGrew |
| 6,347,521 | B1 | 2/2002 | Kadotani et al. |
| 6,357,518 | B1 | 3/2002 | Sugimoto et al. |
| 6,367,261 | B1 | 4/2002 | Marshall et al. |
| 6,385,976 | B1 | 5/2002 | Yamamura et al. |
| 6,393,842 | B2 | 5/2002 | Kim |
| 6,446,442 | B1 | 9/2002 | Batchelor et al. |
| 6,474,073 | B1 | 11/2002 | Uetsuji et al. |
| 6,477,844 | B2 | 11/2002 | Ohkubo et al. |
| 6,499,306 | B2 | 12/2002 | Gillen |
| 6,530,231 | B1 | 3/2003 | Nagy et al. |
| 6,539,725 | B2 | 4/2003 | Bell |
| 6,541,139 | B1 | 4/2003 | Cibuzar |
| 6,548,750 | B1 | 4/2003 | Picone |
| 6,560,968 | B2 | 5/2003 | Ko |
| 6,563,039 | B2 | 5/2003 | Caillat et al. |
| RE38,128 | E | 6/2003 | Gallup et al. |
| 6,580,025 | B2 | 6/2003 | Guy |
| 6,598,403 | B1 | 7/2003 | Ghoshal |
| 6,598,405 | B2 | 7/2003 | Bell |
| 6,605,773 | B2 | 8/2003 | Kok |
| 6,606,866 | B2 | 8/2003 | Bell |
| 6,625,990 | B2 | 9/2003 | Bell |
| 6,637,210 | B2 | 10/2003 | Bell |
| 6,672,076 | B2 | 1/2004 | Bell |
| 6,700,052 | B2 | 3/2004 | Bell |
| 6,705,089 | B2 | 3/2004 | Chu et al. |
| 6,779,348 | B2 | 8/2004 | Taban |
| 6,812,395 | B2 | 11/2004 | Bell |
| 6,880,346 | B1 | 4/2005 | Tseng et al. |
| 6,886,356 | B2 | 5/2005 | Kubo et al. |
| 6,907,739 | B2 | 6/2005 | Bell |
| 6,948,321 | B2 | 9/2005 | Bell |
| 6,959,555 | B2 | 11/2005 | Bell |
| 6,973,799 | B2 | 12/2005 | Kuehl et al. |
| 6,975,060 | B2 | 12/2005 | Styblo et al. |
| 6,986,247 | B1 | 1/2006 | Parise |
| 7,100,369 | B2 | 9/2006 | Yamaguchi et al. |
| 7,111,465 | B2 | 9/2006 | Bell |
| 7,134,288 | B2 | 11/2006 | Crippen et al. |
| 7,171,955 | B2 | 2/2007 | Perkins |
| 7,222,489 | B2 | 5/2007 | Pastorino |
| 7,231,772 | B2 | 6/2007 | Bell |
| 7,235,735 | B2 | 6/2007 | Venkatasubramanian et al. |
| 7,273,981 | B2 | 9/2007 | Bell |
| 7,380,586 | B2 | 6/2008 | Gawthrop |
| 7,421,845 | B2 | 9/2008 | Bell |

(56) References Cited

U.S. PATENT DOCUMENTS

| | | |
|---|---|---|
| 7,475,551 B2 | 1/2009 | Ghoshal |
| 7,523,607 B2 | 4/2009 | Sullivan |
| 7,587,902 B2 | 9/2009 | Bell |
| 7,608,777 B2 | 10/2009 | Bell et al. |
| 7,629,530 B2 | 12/2009 | Inaoka |
| 7,788,933 B2 | 9/2010 | Goenka |
| 7,870,745 B2 | 1/2011 | Goenka |
| 7,921,640 B2 | 4/2011 | Major |
| 7,926,293 B2 | 4/2011 | Bell |
| 7,932,460 B2 | 4/2011 | Bell |
| 7,942,010 B2 | 5/2011 | Bell |
| 7,946,120 B2 | 5/2011 | Bell |
| 8,069,674 B2 | 12/2011 | Bell |
| 8,079,223 B2 | 12/2011 | Bell |
| 8,297,049 B2 | 10/2012 | Ohtani |
| 8,327,634 B2 | 12/2012 | Orihashi et al. |
| 8,445,772 B2 | 5/2013 | Bell et al. |
| 8,495,884 B2 | 7/2013 | Bell et al. |
| 8,613,200 B2 | 12/2013 | LaGrandeur et al. |
| 8,640,466 B2 | 2/2014 | Bell et al. |
| 8,656,710 B2 | 2/2014 | Bell et al. |
| 8,701,422 B2 | 4/2014 | Bell et al. |
| 2001/0029974 A1 | 10/2001 | Cohen et al. |
| 2002/0014261 A1 | 2/2002 | Caillat et al. |
| 2002/0024154 A1 | 2/2002 | Hara et al. |
| 2003/0041892 A1 | 3/2003 | Fleurial et al. |
| 2003/0094265 A1 | 5/2003 | Chu et al. |
| 2003/0106677 A1 | 6/2003 | Memory et al. |
| 2003/0140636 A1 | 7/2003 | Van Winkle |
| 2003/0140957 A1 | 7/2003 | Akiba |
| 2003/0217738 A1 | 11/2003 | Ryon |
| 2003/0223919 A1 | 12/2003 | Kwak et al. |
| 2004/0025516 A1 | 2/2004 | Van Winkle |
| 2004/0045594 A1 | 3/2004 | Hightower |
| 2004/0076214 A1 | 4/2004 | Bell et al. |
| 2004/0089336 A1 | 5/2004 | Hunt |
| 2004/0177876 A1 | 9/2004 | Hightower |
| 2004/0221577 A1 | 11/2004 | Yamaguchi et al. |
| 2004/0261831 A1 | 12/2004 | Tsuneoka et al. |
| 2004/0267408 A1 | 12/2004 | Kramer |
| 2005/0000473 A1 | 1/2005 | Ap et al. |
| 2005/0074646 A1 | 4/2005 | Rajashekara et al. |
| 2005/0105224 A1 | 5/2005 | Nishi |
| 2005/0121065 A1 | 6/2005 | Otey |
| 2005/0139692 A1 | 6/2005 | Yamamoto |
| 2005/0172993 A1 | 8/2005 | Shimoji et al. |
| 2005/0194034 A1 | 9/2005 | Yamaguchi et al. |
| 2005/0217714 A1 | 10/2005 | Nishijima et al. |
| 2005/0263176 A1 | 12/2005 | Yamaguchi et al. |
| 2006/0005548 A1 | 1/2006 | Ruckstuhl |
| 2006/0080979 A1 | 4/2006 | Kitanovski et al. |
| 2006/0086118 A1 | 4/2006 | Venkatasubramanian et al. |
| 2006/0118159 A1 | 6/2006 | Tsuneoka et al. |
| 2006/0124165 A1 | 6/2006 | Bierschenk et al. |
| 2006/0130888 A1 | 6/2006 | Yamaguchi et al. |
| 2006/0157102 A1 | 7/2006 | Nakajima et al. |
| 2006/0168969 A1 | 8/2006 | Mei et al. |
| 2006/0174633 A1 | 8/2006 | Beckley |
| 2006/0179820 A1 | 8/2006 | Sullivan |
| 2006/0219281 A1 | 10/2006 | Kuroyanagi et al. |
| 2006/0240369 A1 | 10/2006 | Duesel, Jr. et al. |
| 2006/0254284 A1 | 11/2006 | Ito et al. |
| 2007/0000255 A1 | 1/2007 | Elliot et al. |
| 2007/0045044 A1 | 3/2007 | Sullivan |
| 2007/0125413 A1 | 6/2007 | Olsen et al. |
| 2007/0193617 A1 | 8/2007 | Taguchi |
| 2007/0220902 A1 | 9/2007 | Matsuoka et al. |
| 2007/0261729 A1 | 11/2007 | Hu |
| 2007/0272290 A1 | 11/2007 | Sims et al. |
| 2008/0035195 A1 | 2/2008 | Bell |
| 2008/0083445 A1 | 4/2008 | Chakraborty |
| 2008/0090137 A1 | 4/2008 | Buck et al. |
| 2008/0115818 A1 | 5/2008 | Cheng et al. |
| 2008/0283110 A1 | 11/2008 | Jin et al. |
| 2008/0289677 A1 | 11/2008 | Bell |
| 2009/0000310 A1 | 1/2009 | Bell et al. |
| 2009/0007572 A1 | 1/2009 | Bell et al. |
| 2009/0007952 A1 | 1/2009 | Kondoh et al. |
| 2009/0038302 A1 | 2/2009 | Yamada et al. |
| 2009/0133734 A1 | 5/2009 | Takahashi et al. |
| 2009/0151342 A1 | 6/2009 | Major |
| 2009/0293499 A1 | 12/2009 | Bell et al. |
| 2009/0301103 A1 | 12/2009 | Bell et al. |
| 2010/0024859 A1 | 2/2010 | Bell et al. |
| 2010/0031987 A1 | 2/2010 | Bell |
| 2010/0052374 A1 | 3/2010 | Bell et al. |
| 2010/0095996 A1 | 4/2010 | Bell |
| 2010/0101238 A1 | 4/2010 | LaGrandeur et al. |
| 2010/0101239 A1 | 4/2010 | Lagrandeur et al. |
| 2010/0236595 A1 | 9/2010 | Bell |
| 2010/0326092 A1 | 12/2010 | Goenka |
| 2010/0331657 A1 | 12/2010 | Mensinger et al. |
| 2011/0067742 A1 | 3/2011 | Bell et al. |
| 2011/0107772 A1 | 5/2011 | Goenka |
| 2011/0162389 A1 | 7/2011 | Bell |
| 2011/0185715 A1 | 8/2011 | Limbeck et al. |
| 2011/0209740 A1 | 9/2011 | Bell et al. |
| 2011/0244300 A1 | 10/2011 | Closek et al. |
| 2011/0247668 A1 | 10/2011 | Bell et al. |
| 2011/0258995 A1 | 10/2011 | Limbeck et al. |
| 2011/0271994 A1 | 11/2011 | Gilley |
| 2012/0073276 A1 | 3/2012 | Meisner et al. |
| 2012/0102934 A1 | 5/2012 | Magnetto |
| 2012/0111386 A1 | 5/2012 | Bell et al. |
| 2012/0174567 A1 | 7/2012 | Limbeck et al. |
| 2012/0174568 A1 | 7/2012 | Bruck et al. |
| 2012/0266608 A1 | 10/2012 | Kadle et al. |
| 2013/0037073 A1 | 2/2013 | LaGrandeur |
| 2013/0068273 A1 | 3/2013 | Kanno et al. |
| 2013/0104953 A1 | 5/2013 | Poliquin et al. |
| 2013/0160809 A1 | 6/2013 | Mueller |
| 2013/0167894 A1 | 7/2013 | Brueck et al. |
| 2013/0186448 A1 | 7/2013 | Ranalli et al. |
| 2013/0255739 A1 | 10/2013 | Kossakovski et al. |
| 2013/0327368 A1 | 12/2013 | Crane |
| 2013/0327369 A1 | 12/2013 | Jovovic et al. |
| 2013/0340802 A1 | 12/2013 | Jovovic et al. |
| 2014/0034102 A1 | 2/2014 | Ranalli et al. |
| 2014/0096807 A1 | 4/2014 | Ranalli |
| 2014/0190185 A1 | 7/2014 | Bell et al. |
| 2014/0224291 A1 | 8/2014 | Bell et al. |

FOREIGN PATENT DOCUMENTS

| | | |
|---|---|---|
| DE | 10 2010 012 629 A1 | 9/2011 |
| DE | 10 2009 003 737 B4 | 12/2012 |
| EP | 1 174 996 A1 | 1/2002 |
| EP | 1 324 400 A | 7/2003 |
| EP | 1 475 532 A | 11/2004 |
| EP | 1 515 376 | 3/2005 |
| EP | 1 679 480 A | 7/2006 |
| EP | 1 780 807 A1 | 5/2007 |
| EP | 2 180 534 A1 | 4/2010 |
| EP | 1 906 463 A3 | 3/2011 |
| EP | 2 381 083 A1 | 10/2011 |
| EP | 2 541 634 A1 | 1/2013 |
| EP | 2 313 938 B1 | 10/2013 |
| FR | 1 280 711 A | 1/1962 |
| FR | 2 316 557 A1 | 1/1977 |
| FR | 2 419 479 A | 10/1979 |
| FR | 2 481 786 A1 | 11/1981 |
| FR | 2543275 | 9/1984 |
| FR | 2 512 499 | 10/1984 |
| FR | 2 550 324 A | 2/1985 |
| FR | 2806666 | 9/2001 |
| FR | 2 879 728 | 6/2006 |
| GB | 231 192 A | 5/1926 |
| GB | 952 678 | 3/1964 |
| GB | 1151947 | 5/1969 |
| GB | 2 027 534 | 2/1980 |
| GB | 2 267 338 | 12/1993 |
| GB | 2 333 352 | 7/1999 |
| JP | 59097457 | 6/1984 |
| JP | 60-80044 | 7/1985 |

(56) References Cited

FOREIGN PATENT DOCUMENTS

| | | |
|---|---|---|
| JP | 63-262076 A | 10/1988 |
| JP | 01 131830 A | 5/1989 |
| JP | 01 200122 | 8/1989 |
| JP | 03-263382 | 11/1991 |
| JP | 04-165234 | 6/1992 |
| JP | 5-219765 | 8/1993 |
| JP | 06-038560 | 2/1994 |
| JP | 06-089955 | 3/1994 |
| JP | 6-342940 | 12/1994 |
| JP | 7-198284 | 1/1995 |
| JP | A-7-7187 | 1/1995 |
| JP | 07-074397 | 3/1995 |
| JP | H07 111334 | 4/1995 |
| JP | 09-321355 | 5/1995 |
| JP | 7 156645 | 6/1995 |
| JP | A-7-202275 | 8/1995 |
| JP | 07-253264 | 2/1996 |
| JP | 08-098569 | 4/1996 |
| JP | 08-222771 | 8/1996 |
| JP | A-8-293627 | 11/1996 |
| JP | 09042801 | 2/1997 |
| JP | 9-089284 A | 4/1997 |
| JP | 09-275692 | 10/1997 |
| JP | 09-276076 | 10/1997 |
| JP | 10 012935 | 1/1998 |
| JP | 10035268 | 2/1998 |
| JP | 10 163538 | 6/1998 |
| JP | H10-325561 | 8/1998 |
| JP | 10238406 A | 9/1998 |
| JP | 10-275943 | 10/1998 |
| JP | 10290590 | 10/1998 |
| JP | 11-317481 | 11/1998 |
| JP | 11-032492 | 2/1999 |
| JP | 11 046021 | 2/1999 |
| JP | 11-182907 | 7/1999 |
| JP | 11-201475 A | 7/1999 |
| JP | 11-274575 | 10/1999 |
| JP | 11-041959 | 12/1999 |
| JP | 2000 018095 | 1/2000 |
| JP | H2000-58930 | 2/2000 |
| JP | 00 208823 | 7/2000 |
| JP | 2000-208823 | 7/2000 |
| JP | 2002-21534 | 7/2000 |
| JP | H2000-214934 | 8/2000 |
| JP | 2000-274788 | 10/2000 |
| JP | 2000-274874 | 10/2000 |
| JP | 2000 286469 A | 10/2000 |
| JP | 2000 323759 | 11/2000 |
| JP | 01 007263 A | 1/2001 |
| JP | 2001-24240 | 1/2001 |
| JP | 2001 210879 | 8/2001 |
| JP | 2001-267642 A | 9/2001 |
| JP | 2001304778 | 10/2001 |
| JP | 2001-336853 | 1/2002 |
| JP | 2002-13758 | 1/2002 |
| JP | 2002059736 A | 2/2002 |
| JP | 2002 111078 | 4/2002 |
| JP | 2002 199761 | 7/2002 |
| JP | 2002 232028 A | 8/2002 |
| JP | 2002 325470 | 11/2002 |
| JP | 2003 86223 | 3/2003 |
| JP | 2003 175720 A | 6/2003 |
| JP | 2003 259671 | 9/2003 |
| JP | 2003 332642 | 11/2003 |
| JP | 2004 079883 | 3/2004 |
| JP | 2004-332596 | 11/2004 |
| JP | 2004 343898 | 12/2004 |
| JP | 2004 360522 | 12/2004 |
| JP | 2004-360681 | 12/2004 |
| JP | 2005 212564 | 8/2005 |
| JP | 2005 317648 | 11/2005 |
| JP | 2006 214350 | 8/2006 |
| JP | 2006-250524 | 9/2006 |
| JP | 2008 042994 | 2/2008 |
| JP | 2008 274790 | 11/2008 |
| JP | 2008 300465 | 12/2008 |
| JP | 2008-546954 | 12/2008 |
| JP | 2009-010138 | 1/2009 |
| JP | 2009 033806 | 2/2009 |
| LU | 66619 | 2/1973 |
| RU | 2 099 642 C1 | 12/1997 |
| RU | 2 142 178 | 11/1999 |
| RU | 2 154 875 C2 | 8/2000 |
| RU | 2174475 | 10/2001 |
| SE | 337 227 | 5/1971 |
| SU | 184886 A | 7/1966 |
| SU | 1142711 A | 2/1985 |
| WO | WO 95/20721 | 8/1995 |
| WO | WO 9722486 | 6/1997 |
| WO | WO 97/47930 | 12/1997 |
| WO | WO 98/50686 | 11/1998 |
| WO | WO 98/56047 | 12/1998 |
| WO | WO 99/10191 | 3/1999 |
| WO | WO 02/081982 | 10/2002 |
| WO | WO 03/074951 | 9/2003 |
| WO | WO 03/104726 | 12/2003 |
| WO | WO 2004/019379 | 3/2004 |
| WO | WO 2004/059139 | 7/2004 |
| WO | WO 2005/023571 | 3/2005 |
| WO | WO 2005/098225 | 10/2005 |
| WO | WO 2006/037178 | 4/2006 |
| WO | WO 2006/064432 | 6/2006 |
| WO | WO 2007/001289 | 1/2007 |
| WO | WO 2007/002891 | 1/2007 |
| WO | WO 2007/109368 | 9/2007 |
| WO | WO 2008/013946 | 1/2008 |
| WO | WO 2008/042077 | 4/2008 |
| WO | WO 2008/091293 | 7/2008 |
| WO | WO 2008/123330 | 10/2008 |
| WO | WO 2012/031980 | 3/2012 |
| WO | WO 2012/045542 | 4/2012 |

OTHER PUBLICATIONS

Derwent-ACC-No. 1998-283540, Kwon, H et al., Hyundai Motor Co., corresponding to KR 97026106 A published Jun. 24, 1997 (2 pages).

Diller, R. W., et al.: "Experimental results confirming improved performance of systems using thermal isolation" Thermoelectrics, 2002. Proceedings ICT '02. Twenty-First International Conference on Aug. 25-29, 2002, Piscataway, NJ USA, IEEE, Aug. 25, 2002, pp. 548-550, XP010637541 ISBN: 0-7803-7683-8.

Diller, R.W., et al., "Experimental Results Confirming Improved Efficiency of Thermoelectric Power Generation Systems with Alternate Thermodynamic Cycles," 22nd International Conference on Thermodynamics, 2003, pp. 571-573.

Fleurial, et al., "Development of Segmented Thermoelectric Multicopule Converter Technology," Aerospace Conference, 2006 IEEE Big Sky, Mt., Mar. 4-11, 2006, pp. 1-10.

Hendricks, Terry et al., "Advanced Thermoelectric Power System Investigations for Light-Duty and Heavy Duty Applications," National Renewable Energy Laboratory, Center for Transportation Technology & Systems, Colorado, 2002.

Menchen, et al., "Thermoelectric Conversion to Recover Heavy Duty Diesel Exhaust Energy", Proceedings of the Annual Automotive Technology Development Contractors Meeting, pp. 445-449, Apr. 1991.

Miner, A., et al. "Thermo-Electro-Mechanical Refrigeration Based on Transient Thermoelectric Effects", Applied Physics letters, vol. 75, pp. 1176-1178 (1999).

Snyder, G. Jeffrey, et al., "Thermoelectric Efficiency and Compatibility," The American Physical Society, Oct. 2, 2003, vol. 91, No. 14.

Snyder, G. Jeffrey: "Application of the compatibility factor to the design of segmented and cascaded thermoelectric generators" Applied Physics Letters, AIP, American Institute of Physics, Melville, NY, vol. 84, No. 13, Mar. 29, 2004, pp. 2436-2438, XPO12060957 ISSN: 0003-6951.

Tada, S., et al., "A New Concept of Porous Thermoelectric Module Using a Reciprocating Flow for Cooling/Heating Systems (Numeri-

(56) References Cited

OTHER PUBLICATIONS cal Analysis for Heating Systems)" 16th International Conference on Thermoelectrics (1977).

Ursell, T.S. et al., "Compatibility of Segmented Thermoelectric Generators," 21st International Conference on Thermoelectronics, 2002, p. 412-417.

Chinese First Office Action, and Search Report for CN Appl. No. 201080042613.1, dated Feb. 17, 2014 (w/Translation).

Funahashi et al., "Preparation and properties of thermoelectric pipe-type modules", ICT 25th International Conference on Aug. 6-10, 2006, Thermoelectrics, 2006, pp. 58-61.

Funahashi, et al., "A portable thermoelectric-power-generating module composed of oxide devices," Journal of Applied Physics 99, 066117 (2006).

International Search Report and Written Opinion dated Dec. 16, 2013, Application No. PCT/US2013/022299, filed Jan. 18, 2013 in 15 pages.

International Search Report and Written Opinion re Application No. PCT/US2013/052776, mailed Mar. 17, 2014.

International Search Report with Written Opinion dated Mar. 17, 2010, Application No. PCT/US2009/046166, filed Jun. 3, 2009.

Min et al., "Ring-structured thermoelectric module", Semiconductor Science and Technology, Aug. 2007, vol. 22, No. 8, pp. 880-888.

Thermoelectrics Handbook: Macro to Nano, 2006, Chpt. 11, Section 11.7, pp. 11-11 to 11-15, CRC Press, Boca Raton, FL.

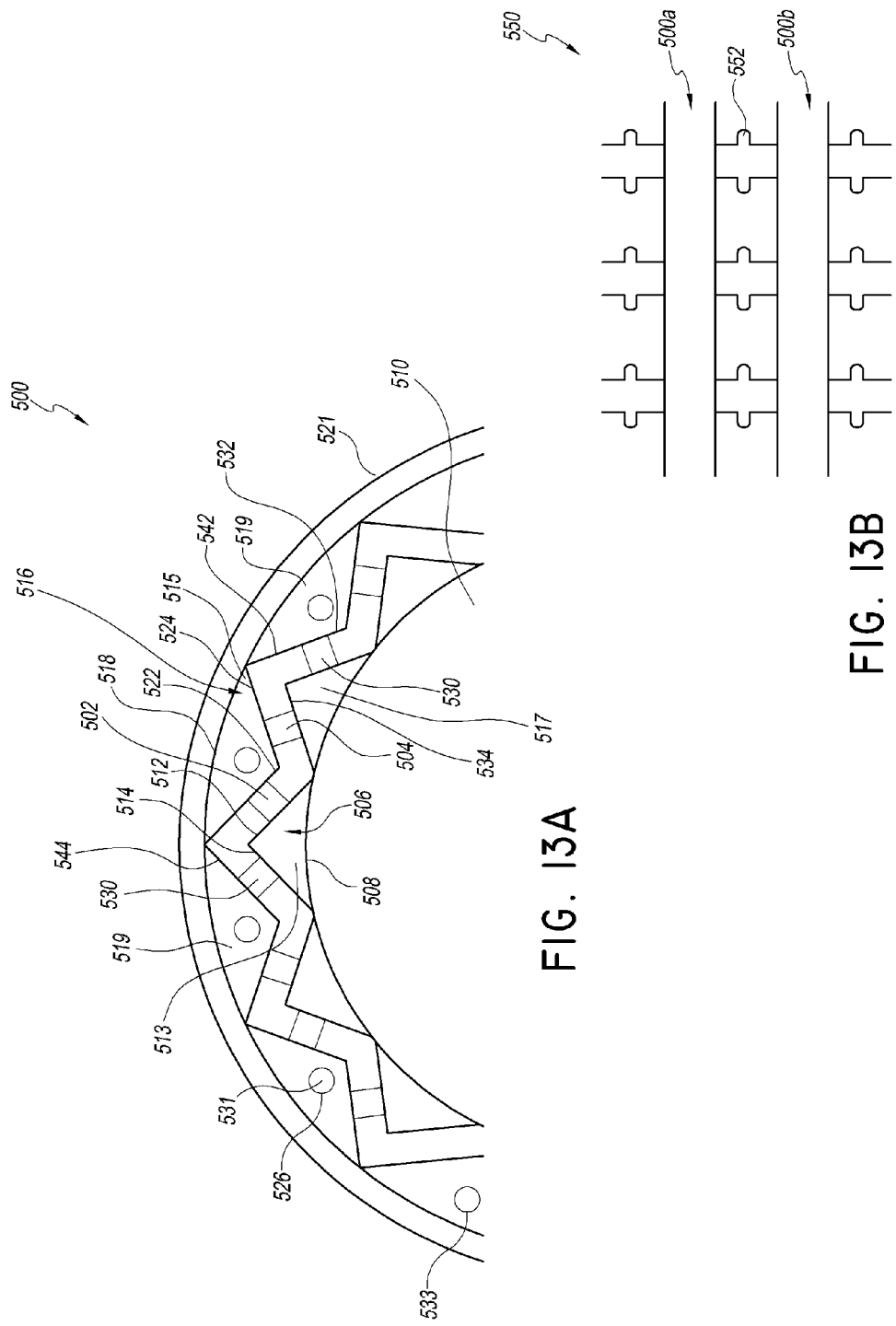

_US 9,006,557 B2_

SYSTEMS AND METHODS FOR REDUCING CURRENT AND INCREASING VOLTAGE IN THERMOELECTRIC SYSTEMS

CROSS-REFERENCE TO RELATED APPLICATIONS

This application claims the benefit of U.S. Provisional Application No. 61/493,842 filed Jun. 6, 2011 and U.S. Provisional Application No. 61/493,899 filed Jun. 6, 2011, each of which are incorporated herein in its entirety by reference. This application is related to U.S. patent application Ser. No. 13/489,237, entitled "Cartridge-Based Thermoelectric Devices," filed on even date herewith, which is incorporated in its entirety by reference herein, and U.S. patent application Ser. No. 13/488,989, entitled "Thermoelectric Devices With Reduction of Interfacial Losses," filed on even date herewith, which is incorporated in its entirety by reference herein.

STATEMENT REGARDING FEDERALLY SPONSORED R&D

The U.S. Government may claim to have certain rights in this invention or parts of this invention under the terms of Contract No. DOE DE-FC26-04NT42279 and ONR Contract N00014-08-C-0161.

BACKGROUND

1. Field

The present application relates generally to thermoelectric cooling, heating, and power generation systems.

2. Description of the Related Art

For the automotive as well as other applications, it can be important that the voltage of a device providing power be at a certain level. In the automotive case, nominal voltage should be 14V. A cylindrical thermoelectric power generator (TEG) has been developed that takes advantage of the hoop stress of a thermally expanding cylinder inside of a ring shunt in order to improve thermal contact. (For example, see U.S. Patent Publication No. 2011/0067742 A1, which is incorporated in its entirety by reference herein.) To best take advantage of the hoop stress, the ring is a solid or split ring. In order to accommodate large mass flows and keep pressure drop at a minimum, diameters of the cylindrical TEG are relatively large which results in many parallel connections of the thermoelectric couples.

SUMMARY

In certain embodiments, a thermoelectric assembly is provided that can be configured to be in thermal communication with a generally tubular first fluid conduit configured to allow a first fluid to flow through the first fluid conduit along a first direction. The thermoelectric assembly can extend at least partially around a perimeter of the first fluid conduit. The thermoelectric assembly can comprise a plurality of thermoelectric sub-assemblies aligned with one another along the perimeter of the first fluid conduit. Each thermoelectric sub-assembly of the plurality of thermoelectric sub-assemblies can comprise a plurality of thermoelectric elements in parallel electrical communication with one another. Each thermoelectric sub-assembly of the plurality of thermoelectric sub-assemblies can further comprise at least one shunt comprising a first portion and a second portion. The first portion can be in thermal communication with and mechanically coupled to the plurality of thermoelectric elements and configured to be in thermal communication with at least one second fluid conduit. The second portion can be in thermal communication with and mechanically coupled to the first portion and have a curved surface configured to be in thermal communication with the first fluid conduit. Each thermoelectric sub-assembly can further comprise a plurality of electrically insulating elements configured to prevent current flow in a plane perpendicular to the first direction between adjacent thermoelectric sub-assemblies of the plurality of thermoelectric sub-assemblies.

In certain embodiments, a thermoelectric system is provided that can comprise at least a first thermoelectric assembly and a second thermoelectric assembly as discussed above. The first and second thermoelectric assemblies can be adjacent and generally parallel to one another. The plurality of thermoelectric sub-assemblies of each of the first and second thermoelectric assemblies can comprise a first set of thermoelectric sub-assemblies each comprising a plurality of p-type thermoelectric elements in parallel electrical communication with one another. The plurality of thermoelectric sub-assemblies of each of the first and second thermoelectric assemblies can comprise a second set of thermoelectric sub-assemblies each comprising a plurality of n-type thermoelectric elements in parallel electrical communication with one another. The plurality of thermoelectric sub-assemblies can be arranged such that the first set of thermoelectric sub-assemblies alternate with the second set of thermoelectric sub-assemblies along the second direction. The first set of thermoelectric sub-assemblies of the first thermoelectric assembly can be in series electrical communication with the second set of thermoelectric sub-assemblies of the second thermoelectric assembly. The second set of thermoelectric sub-assemblies of the first thermoelectric assembly can be in series electrical communication with the first set of thermoelectric sub-assemblies of the second thermoelectric assembly.

In certain embodiments, a thermoelectric assembly is provided that can be configured to be mounted in thermal communication with a generally tubular fluid conduit extending along a direction. The thermoelectric assembly can comprise a plurality of thermoelectric sub-assemblies. Each thermoelectric sub-assembly of the plurality of thermoelectric sub-assemblies can comprise a plurality of thermoelectric elements and at least one shunt in thermal communication with and mechanically coupled to the plurality of thermoelectric elements. The at least one shunt can be configured to be mounted in thermal communication with the generally tubular fluid conduit. The plurality of thermoelectric sub-assemblies can be positionable to be aligned with one another to extend at least partially around a perimeter of the generally tubular fluid conduit. The thermoelectric assembly can further comprise at least one coupler configured to mechanically couple the plurality of thermoelectric sub-assemblies to the generally tubular fluid conduit. The at least one coupler can comprise at least one elongate element mechanically coupled to the plurality of thermoelectric sub-assemblies. The at least one tightening mechanism can be mechanically coupled to a first portion of the at least one elongate element and to a second portion of the at least one elongate element. The at least one tightening mechanism can be configured to pull the first portion and the second portion such that the at least one elongate element presses the plurality of thermoelectric sub-assemblies against the generally tubular fluid conduit.

A thermoelectric system can comprise a plurality of thermoelectric assemblies as discussed above, wherein the pluralities of thermoelectric sub-assemblies of adjacent thermoelectric assemblies of the plurality of thermoelectric assemblies can extend at least partially around perimeters of the generally tubular fluid conduit that are generally parallel to one another. The plurality of thermoelectric assemblies can be coupled to one another such that the pluralities of thermoelectric elements of adjacent thermoelectric assemblies are in series electrical communication with one another and are aligned with one another in a direction generally perpendicular to the perimeters.

In some embodiments, a thermoelectric assembly is provided that can be configured to be in thermal communication with a generally tubular first fluid conduit configured to allow a first fluid to flow through the first fluid conduit along a first direction. The thermoelectric assembly can extend at least partially around a perimeter of the first fluid conduit and comprise a plurality of thermoelectric elements. The thermoelectric assembly can comprise at least one shunt comprising a first portion and a second portion. The first portion can be in thermal communication with and mechanically coupled to the plurality of thermoelectric elements. The second portion can be in thermal communication with and mechanically coupled to the first portion and have a curved surface configured to be in thermal communication with the first fluid conduit. The thermoelectric assembly can further comprise at least one electrically insulating element configured to electrically isolate the plurality of thermoelectric elements from the at least one shunt.

In certain embodiments, a thermoelectric assembly is provided that can comprise at least one shunt configured to allow a first fluid to flow through a region at least partially bounded by the at least one shunt. The at least one shunt can be in thermal communication with the first fluid. The thermoelectric assembly can further comprise a plurality of thermoelectric elements in thermal communication with and distributed along at least one surface of the at least one shunt. The thermoelectric assembly can also comprise a housing in thermal communication with the plurality of thermoelectric elements. The plurality of thermoelectric elements can be enclosed by the housing and the at least one shunt.

In some embodiments, a thermoelectric assembly is provided that can be configured to be mounted in thermal communication with a fluid conduit. The thermoelectric assembly can comprise a plurality of thermoelectric sub-assemblies. Each thermoelectric sub-assembly can comprise at least one thermoelectric element and at least one shunt in thermal communication with and mechanically coupled to the at least one thermoelectric element. The at least one shunt can be configured to be mounted in thermal communication with the fluid conduit. Each thermoelectric assembly can comprise at least one coupler configured to mechanically couple the plurality of thermoelectric sub-assemblies together such that adjacent thermoelectric sub-assemblies of the plurality of thermoelectric sub-assemblies can rotate relative to one another.

In some embodiments, a thermoelectric system is provided that can comprise a plurality of thermoelectric assemblies as discussed above. The plurality of thermoelectric sub-assemblies of each thermoelectric assembly of the plurality of thermoelectric assemblies can extend at least partially around one or more perimeters of the fluid conduit.

In certain embodiments, a thermoelectric assembly is provided that can comprise at least one first thermoelectric element and at least one second thermoelectric element. The thermoelectric assembly can comprise a first plurality of shunts. Each shunt of the first plurality of shunts can comprise a first surface portion configured to be in thermal communication with at least a first fluid conduit, a second surface portion, and a third surface portion. The second surface portion and the first surface portion can define a first non-zero angle therebetween and the third surface portion and the first surface portion can define a second non-zero angle therebetween. The thermoelectric assembly can further comprise a second plurality of shunts. Each shunt of the second plurality of shunts can comprise a fourth, fifth and sixth surface portion. The fifth surface portion and the fourth surface portion can define a third non-zero angle therebetween. The sixth surface portion and the fourth surface portion can define a fourth non-zero angle therebetween. The at least one first thermoelectric element can be between and in thermal communication with the second surface portion of a first shunt of the first plurality of shunts and the fifth surface portion of a second shunt of the second plurality of shunts. The at least one second thermoelectric element can be between and in thermal communication with the sixth surface portion of the second shunt of the second plurality of shunts and the third surface portion of a third shunt of the first plurality of shunts.

In some embodiments, a thermoelectric system can comprise a plurality of thermoelectric assemblies as discussed above. The at least a first fluid conduit can comprise a tube having a generally circular cross-section in a plane perpendicular to the tube. The adjacent thermoelectric assemblies can extend along perimeters of the tube that are generally parallel to one another.

In certain embodiments, a thermoelectric assembly is provided that can be configured to be in thermal communication with a first fluid at a first temperature. The thermoelectric assembly can comprise a first plurality of thermoelectric elements and at least one first heat exchanger comprising a first portion substantially surrounding a region containing the first fluid. The at least one first heat exchanger can comprise at least one second portion extending in a direction generally away from the region. The thermoelectric assembly can further comprise at least one second heat exchanger configured to be in thermal communication with and mechanically coupled to at least one fluid conduit containing a second fluid at a second temperature different from the first temperature. The first plurality of thermoelectric elements can be between and in thermal communication with the at least one second portion of the at least one first heat exchanger and the at least one second heat exchanger. The thermoelectric assembly can further comprise at least one electrically insulating layer between the at least one second portion of the at least one first heat exchanger and the first plurality of thermoelectric elements.

In some embodiments, a thermoelectric system is provided that can comprise a plurality of thermoelectric assemblies as discussed above wherein adjacent thermoelectric assemblies are generally parallel to one another.

BRIEF DESCRIPTION OF THE DRAWINGS

Various embodiments are depicted in the accompanying drawings for illustrative purposes, and should in no way be interpreted as limiting the scope of the thermoelectric assemblies or systems described herein. In addition, various features of different disclosed embodiments can be combined with one another to form additional embodiments, which are part of this disclosure. Any feature or structure can be removed, altered, or omitted. Throughout the drawings, reference numbers may be reused to indicate correspondence between reference elements.

FIG. 13A schematically illustrates an example TE assembly having triangular shunts in accordance with certain embodiments herein.

FIG. 13B schematically illustrates an example TE system comprising a plurality of TE assemblies of FIG. 13A in accordance with certain embodiments herein.

DETAILED DESCRIPTION

Figure 1:
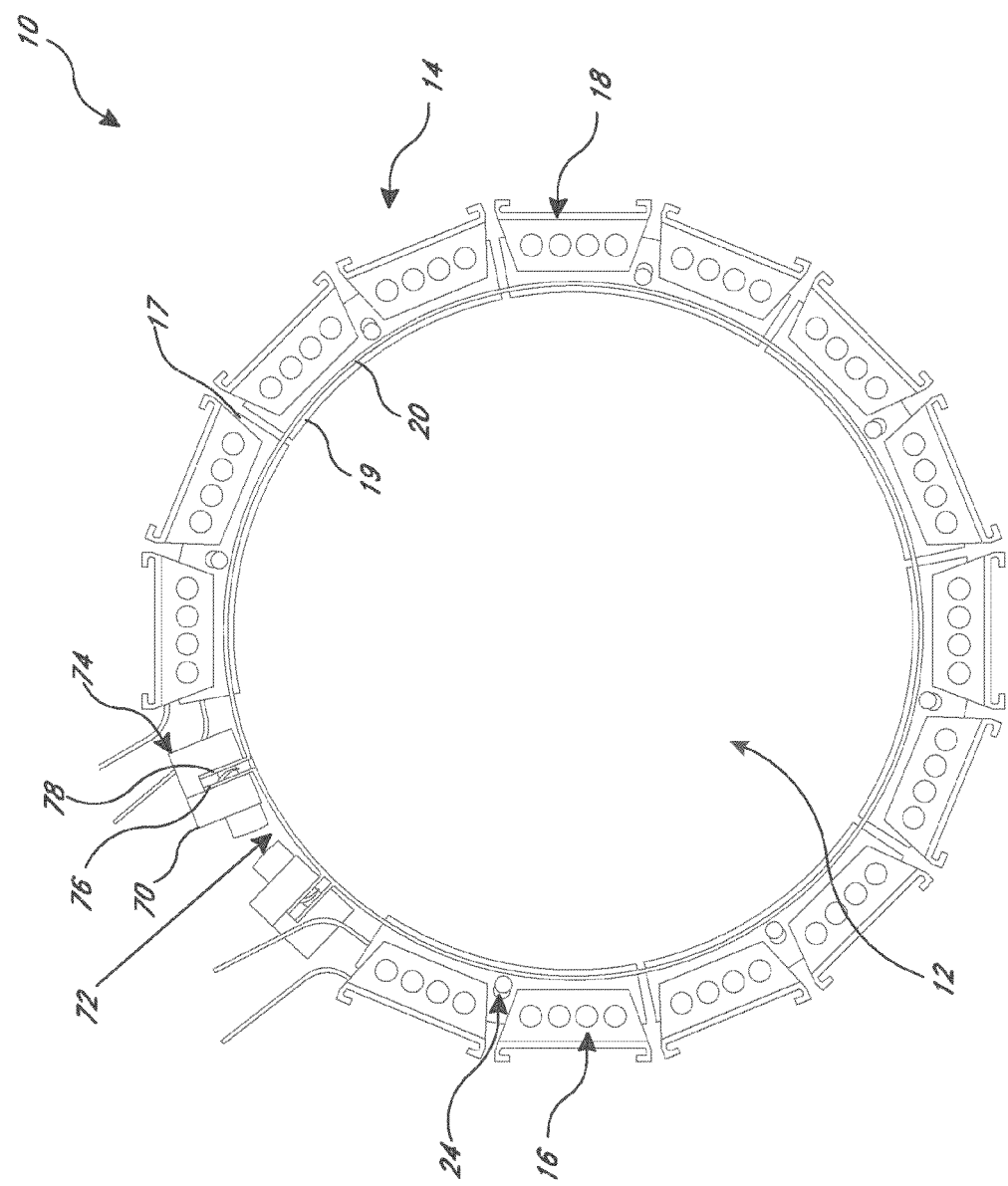
FIG. 1 schematically illustrates an end view of an example TE assembly having a plurality of TE sub-assemblies and/or a coupler in accordance with certain embodiments herein.

Although certain embodiments and examples are disclosed herein, the subject matter extends beyond the examples in the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

The multiple parallel connections of the thermoelectric couples of earlier configurations can lead to very high current and very low voltage for the device. A power converter can be added to the system to increase the voltage and reduce current, but this adds additional cost and takes up valuable package space, and comes with an efficiency hit.

For example, a cylindrical TEG can comprise thermoelectric (TE) elements (e.g., p-type and n-type semiconductors) that are distributed along the perimeter of a ring. A stack of such rings can be connected together in a device. In such a configuration some or all of the p-type TE elements on the individual rings are electrically connected in parallel to one another and some or all of the n-type TE elements on the individual rings are electrically connected in parallel with one another. Ring to ring connection can be achieved on the cold side using the cooling block or conduit as an electrically conducting element that electrically connects the rings. Large numbers of thermoelectric elements connected in parallel can result in low voltage and high current outputs from the device.

A thermoelectric system as described herein can be a thermoelectric power generator (TEG) which uses the temperature difference between two fluids to produce electrical power via thermoelectric materials. Alternatively, a thermoelectric system as described herein can be a heater, cooler, or both which serves as a solid state heat pump used to move heat from one fluid to another, thereby creating a temperature difference between the two fluids via the thermoelectric materials. Each of the fluids can be liquid, gas, or a combination of the two, and the two fluids can both be liquid, can both be gas, or one can be liquid and the other can be gas.

The thermoelectric system can include a single thermoelectric assembly or a group of thermoelectric assemblies, depending on usage, power output, heating/cooling capacity, coefficient of performance (COP) or voltage. Although the examples described herein may be described in connection with either a power generator or a heating/cooling system, the described features can be utilized with either a power generator or a heating/cooling system.

As used herein, the terms "shunt" and "heat exchanger" have their broadest reasonable interpretation, including but not limited to a component (e.g., a thermally conductive device or material) that allows heat to flow from one portion of the component to another portion of the component. Shunts can be in thermal communication with one or more thermoelectric materials (e.g., one or more thermoelectric elements) and in thermal communication with one or more heat exchangers of the thermoelectric assembly or system. Shunts described herein can also be electrically conductive and in electrical communication with the one or more thermoelectric materials so as to also allow electrical current to flow from one portion of the shunt to another portion of the shunt (e.g., thereby providing electrical communication between multiple thermoelectric materials or elements). Heat exchangers can be in thermal communication with the one or more shunts and one or more working fluids of the thermoelectric assembly or system. Various embodiments of one or more shunts and one or more heat exchangers can be used (e.g., one or more shunts and one or more heat exchangers can be portions of the same unitary element, one or more shunts can be in electrical communication with one or more heat exchangers, one or more shunts can be electrically isolated from one or more heat exchangers, one or more shunts can be in direct thermal communication with the thermoelectric elements, one or more shunts can be in direct thermal communication with the one or more heat exchangers, an intervening material can be positioned between the one or more shunts and the one or more heat exchangers). Furthermore, as used herein, the words "cold," "hot," "cooler," "hotter" and the like are relative terms, and do not signify a particular temperature or temperature range.

Segmented Cylindrical Assembly

Figure 2A:
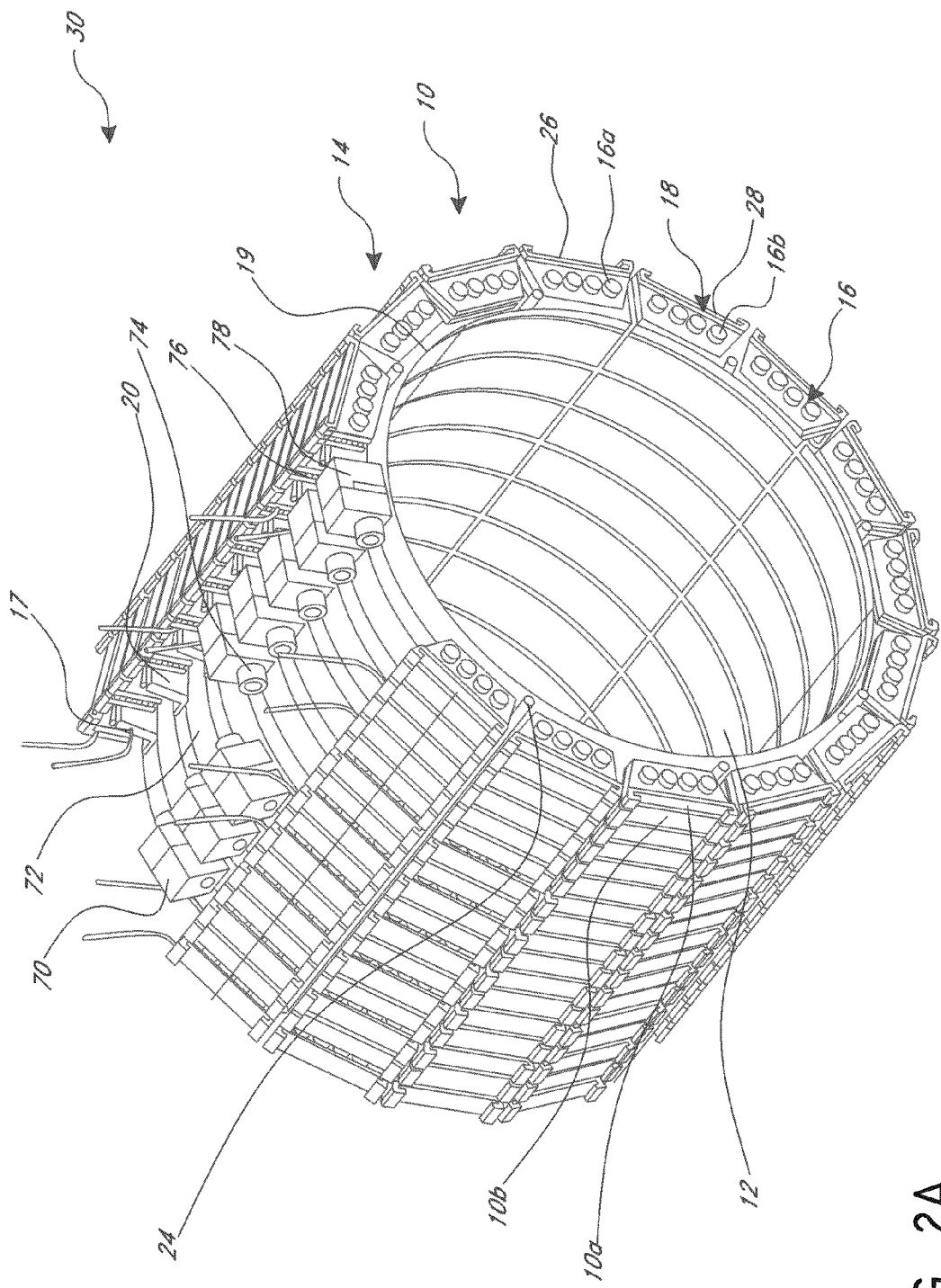
FIG. 2A schematically illustrates a perspective view of an example TE system comprising a plurality of TE assemblies in accordance with certain embodiments herein.
Figure 2B:
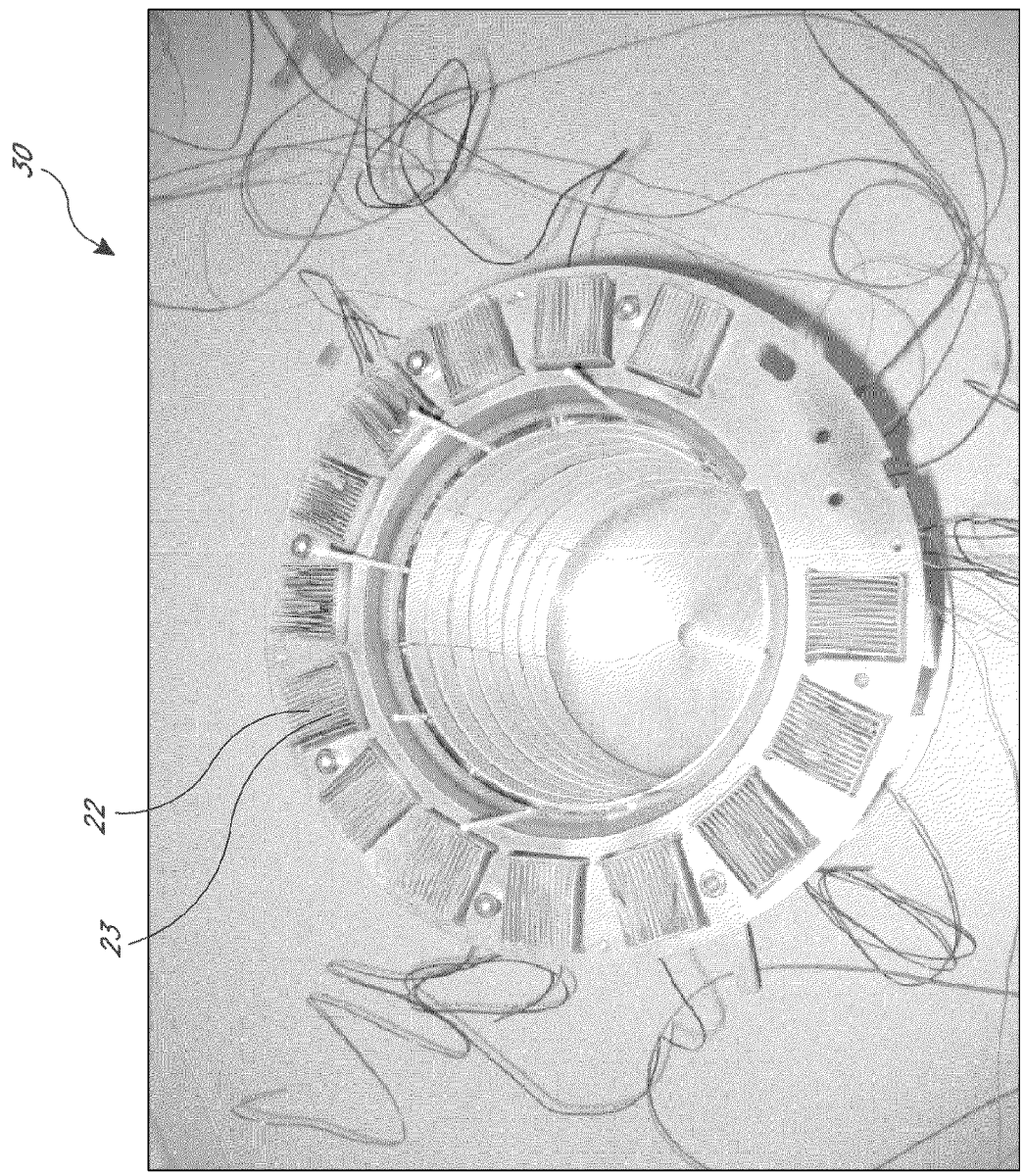
FIG. 2B illustrates an example TE system built in accordance with certain embodiments described herein.

FIG. 1 schematically illustrates an end view of an example thermoelectric (TE) assembly 10 configured to be in thermal communication with a tubular or generally tubular first fluid conduit 12 that is configured to allow a first fluid to flow through the first fluid conduit 12 along a first direction. FIG. 2A schematically illustrates a perspective view of an example TE system comprising a plurality of TE assemblies 10 (e.g., such as shown in FIG. 1). FIG. 2B is a photograph of an example TE system built in accordance with certain embodiments described herein.

The TE assembly 10 extends at least partially around a perimeter of the first fluid conduit 12 (e.g., along a second direction different from the first direction). The TE assembly 10 can comprise a plurality of TE sub-assemblies 14 aligned with one another along the perimeter of the first fluid conduit 12. Each TE sub-assembly 14 can comprise a plurality of TE elements 16 (e.g., n-type and p-type materials) and at least one shunt 17 that comprises a first portion 18 and a second portion 20. The first portion 18 of the shunt 17 can be in thermal communication with and mechanically coupled to the plurality of TE elements 16 and can be configured to be in thermal communication with at least one second fluid conduit 22. The second portion 20 of the shunt 17 can be in thermal communication with and mechanically coupled to the first portion 18 and can have a curved surface 19 configured to be in thermal communication with the first fluid conduit 12. Each TE sub-assembly 14 can further comprise a plurality of electrically insulating elements 24 configured to prevent current flow in a plane perpendicular to the first direction between adjacent TE sub-assemblies of the plurality of TE sub-assemblies 14.

In some embodiments, rather than having a large first fluid conduit 12, as shown in FIGS. 1 and 2A, a TE assembly can comprise multiple smaller diameter tubes that can be connected electrically in series. Multiple TE sub-assemblies can be aligned with one another along the perimeter of each multiple, smaller diameter tube. These tubes can still take advantage of the hoop stress to improve thermal contact, but would have fewer TE elements in parallel. An appropriate number of smaller diameter tubes can be used to maintain appropriate pressure drop. The multiple, smaller tubes can also be connected in parallel and series for further electrical redundancy.

In certain embodiments, the TE assembly 10 comprises a generally planar ring or ring portion extending or encircling the first fluid conduit 12 (e.g., as shown in FIGS. 1 and 2A).

The TE sub-assemblies 14 of the TE assembly 10 can be aligned end-to-end with adjacent TE sub-assemblies 14 of the TE assembly 10 to form the generally planar ring or ring portion. In some embodiments, the curved surface 19 of the second portion 20 can be curved in a first cross-sectional plane of the at least one shunt 17 and straight in a second cross-sectional plane of the at least one shunt 17 that is perpendicular to the first cross-sectional plane. The at least one shunt 17 can comprise at least one electrically insulating layer or material (e.g. ceramic, plastic, epoxy, glue) for electrically isolating the plurality of TE elements 16 from the first fluid conduit 12 and from the at least one second fluid conduit 22. In some embodiments, the at least one shunt 17 can comprise a metallic material (e.g., copper, aluminum) in electrical communication with the plurality of TE elements 16 and electrically isolated from the first fluid conduit 12 and the at least one second fluid conduit 22. The plurality of TE elements 16 of a TE sub-assembly 14 can be in parallel electrical communication with one another, but in series electrical communication with the TE elements 16 of one or more TE sub-assemblies 14 of other TE assemblies 10, as described more fully below.

In some embodiments, the plurality of TE sub-assemblies 14 can comprise a first set of TE sub-assemblies 26 each comprising a plurality of p-type TE elements 16a. The plurality of TE sub-assemblies 14 can also comprise a second set of TE sub-assemblies 28 each comprising a plurality of n-type TE elements 16b. The plurality of TE sub-assemblies 14 can be arranged such that the first set 26 and the second set 28 of TE sub-assemblies alternate along the perimeter of the first fluid conduit 12 (e.g., along a second direction perpendicular to the first direction). The first set 26 and the second set 28 of TE sub-assemblies can alternate in various different patterns along the perimeter. For example, every other set along the perimeter can be of the first set 26 or the second set 28. In other embodiments, there can be two first sets 26 alternating with two second sets 28 along the perimeter.

In certain embodiments, each TE sub-assembly 14 is configured to be in thermal communication with at least one second fluid conduit 22. The at least one second fluid conduit 22 is configured to allow a second fluid to flow through at least the second fluid conduit in a direction parallel or generally parallel to the first direction. For example, as shown in FIG. 2B, each second fluid conduit 22 can comprise a plurality of fins 23 within the second fluid conduit 22 to facilitate heat transfer with the second fluid flowing through the second fluid conduit 22. Other directions of flow of the second fluid can also be used.

The electrically insulating elements 24 can comprise a plurality of electrically insulating layers or spacers positioned between adjacent TE sub-assemblies of the plurality of TE sub-assemblies 14 of the TE assembly 10. The electrically insulating elements 24 can comprise gaps between adjacent TE sub-assemblies 14, containing either a gas or a vacuum. In some embodiments, the electrically insulating elements 24 can comprise a ceramic material. However, other materials can be used, including but not limited to plastics, epoxies, and glues. The electrically insulating elements 24 can have various shapes and dimensions.

In some embodiments, a TE system 30 can comprise at least a first TE assembly 10a and a second TE assembly 10b as described in any of the embodiments above. The first and second TE assemblies 10a, 10b can be adjacent and parallel or generally parallel to one another and can each comprise a plurality of TE sub-assemblies 14, as shown in FIG. 2A. The TE sub-assemblies 14 can comprise first and second sets of TE sub-assemblies 26, 28 and can be arranged such that the first and second sets alternate along the perimeter of the first fluid conduit 12 as described above. Further, the first set of TE sub-assemblies 26 of the first TE assembly 10a can be in series electrical communication with the second set of TE sub-assemblies 28 of the second TE assembly 10b. The second set of TE sub-assemblies 28 of the first TE assembly 10a can be in series electrical communication with the first set of TE sub-assemblies 26 of the second TE assembly 10b. In certain such embodiments, the TE assemblies 10 are in series electrical communication with one another, thereby allowing the TE system 30 to be operated with reduced electrical current. The electrical current flowing through the TE system 30 can flow in an axial direction along the first fluid conduit 12. In certain such embodiments, an electrical coupler can be used to connect two TE sub-assemblies 14 of a TE assembly 10 at an end of the TE system 30 such that the two TE sub-assemblies 14 are in series electrical communication with one another. Such a configuration can be used so that substantially all the TE sub-assemblies 14 of the TE system 30 are in series electrical communication with one another.

The plurality of electrically insulating elements 24 can also comprise one or more electrically insulating rods extending through one or more holes, channels or slots formed in the at least one shunt 17 of the plurality of TE sub-assemblies 14 or the TE sub-assemblies 14 themselves. The electrically insulating elements 24 can be configured to avoid shorts or unwanted electrical connections between the TE assemblies 10 that would divert electrical current from flowing through the TE elements 16. The electrically insulating elements 24 can be cylindrical rods or tubes but various other shapes are possible including but not limited to squares, rectangles, triangles, etc.

In some embodiments, the TE system 30 can be a cylindrical TEG having a first fluid conduit 12 comprising a thermally expanding cylinder located inside of or within a ring shunt 17 with one or more TE assemblies 10 that are separated into TE sub-assemblies 14 or segments. These TE sub-assemblies 14 of the one or more TE assemblies 10 can further be electrically isolated from another by spacers or rods that run along the axial direction of the cylinder.

Segmented Cylindrical Assembly with Band and Tightening Mechanism

FIG. 1 schematically illustrates an end view of an example thermoelectric (TE) assembly 10 configured to be mounted in thermal communication with a tubular or generally tubular first fluid conduit 12 extending along a direction. With reference to FIGS. 1 and 2A, the TE assembly 10 can comprise a plurality of TE sub-assemblies 14 with each TE sub-assembly 14 comprising a plurality of TE elements 16 and at least one shunt 17 in thermal communication with and mechanically coupled to the plurality of TE elements 16. The at least one shunt 17 can be configured to be mounted in thermal communication with the tubular or generally tubular fluid conduit 12. The plurality of TE sub-assemblies 14 are positionable to be in aligned with one another to extend at least partially around a perimeter of the tubular or generally tubular fluid conduit 12. In some embodiments, a cylindrical TEG can be divided or split into TE sub-assemblies 14 or segments, as shown in FIGS. 1 and 2A.

In some embodiments, the TE assembly 10 can further comprise at least one coupler 70 configured to mechanically couple the plurality of TE sub-assemblies 14 to the tubular or generally tubular fluid conduit 12. The at least one coupler 70 can comprise at least one elongate element 72 mechanically coupled to the plurality of TE sub-assemblies 14 and at least one tightening mechanism 74 mechanically coupled to a first portion 76 and a second portion 78 of the at least one elongate element 72. For example, the TE segments can be compressed against the tubular or generally tubular fluid conduit 12 with the elongate element 72 such as a band. The tightening mechanism 74 can be configured to pull the first portion 76 and the second portion 78 such that the at least one elongate element 72 presses the plurality of TE sub-assemblies 14 against the tubular or generally tubular fluid conduit 12. For example, a tightening mechanism 74 such as a screw or other mechanism coupled to the band can be used to pull or press the TE segments against the tubular or generally tubular fluid conduit 12.

In some embodiments, the at least one elongate element 72 is electrically isolated from the plurality of TE elements 16. The TE assembly 10 can further comprise at least one electrically insulating material positioned between the at least one elongate element 72 and the plurality of TE sub-assemblies 14 with the at least one electrically insulating material selected from a group of materials consisting of: ceramic, alumina, mica.

In some embodiments, the at least one elongate element 72 comprises a refractory metal band. The band can be made of materials such as molybdenum. The band can be electrically isolated from the TE sub-assemblies 14, the fluid conduit 12, or both by the use of a ceramic coating such as alumina, aluminum oxide, diamond, nitrides, cuprites, ceria, zirconia, diamond or aluminates. In some embodiments, the band can be wrapped with mica or any other type of insulating material.

In certain embodiments, the at least one elongate element 72 has a first CTE equal to a second CTE of the tubular or generally tubular fluid conduit 12. For example, a band can have the same thermal coefficient of thermal expansion as the fluid conduit 12, providing the hoop stress for better thermal contact.

In some embodiments, a TE system 30 can comprise a plurality of TE assemblies 10 as described above that can be positioned or stacked adjacent to one another. The plurality of TE sub-assemblies 14 of adjacent TE assemblies 10 extend at least partially around the perimeters of the tubular or generally tubular fluid conduit 12 and are parallel or generally parallel to one another. The plurality of TE assemblies 10 are coupled to one another such that the plurality of TE elements 16 of adjacent TE assemblies 10 are in series electrical communication with one another and are aligned in a direction generally perpendicular to the perimeters of the fluid conduit 12.

As described above, in some embodiments, the plurality of TE assemblies 10 can comprise one or more holes or apertures. The TE system 30 can comprise a plurality of ceramic rods or other type of electrically insulating structures extending through the one or more holes of the plurality of TE assemblies 10 in the direction generally perpendicular to the perimeters of the fluid conduit 12.

In some embodiments, the one or more holes are slotted to allow the plurality of TE assemblies 10 to move relative to the plurality of ceramic rods in a radial direction in response to thermal expansion or contraction of portions of the TE system 30.

In some embodiments, the TE system 30 can comprise electrically insulating spacers between the adjacent TE assemblies 10 and/or their sub-assemblies 14 of the plurality of TE assemblies. The TE system 30 can further comprise a plurality of fluid conduits in thermal communication with the plurality of TE sub-assemblies 14. The tubular or generally tubular fluid conduit 12 can contain a first fluid with a first temperature different from a second temperature of a second fluid contained by the plurality of fluid conduits.

Assembly with Electrically Isolating Inserts

Figure 3:
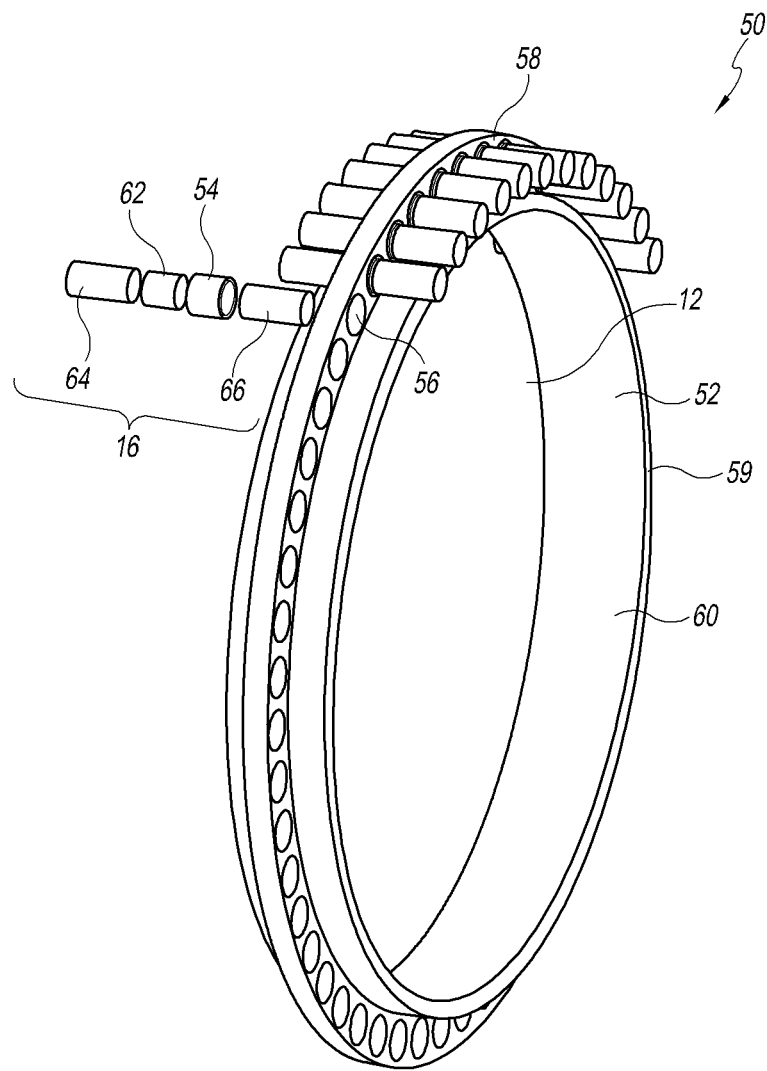
FIG. 3 schematically illustrates a partial exploded view of a portion of an example TE assembly with electrically isolating inserts in accordance with certain embodiments herein.

FIG. 3 schematically illustrates a partial exploded view of a portion of an example thermoelectric (TE) assembly 50 configured to be in thermal communication with a tubular or generally tubular first fluid conduit 12 that is configured to allow a first fluid to flow through the first fluid conduit 12 along a first direction. The TE assembly 50 extends at least partially around a perimeter of the first fluid conduit 12 (e.g., along a second direction perpendicular to the first direction).

The TE assembly 50 can comprise a plurality of TE elements 16 (e.g. n-type and p-type materials) and at least one shunt 52 that comprises a first portion 58 and a second portion 60. The first portion 58 of the at least one shunt 52 can be in thermal communication with and mechanically coupled to the plurality of TE elements 16. The second portion 60 of the at least one shunt 52 can be in thermal communication with and mechanically coupled to the first portion 58 and can have a curved surface 59 configured to be in thermal communication with the first fluid conduit 12. The TE assembly 50 can further comprise at least one electrically insulating element 54 configured to electrically isolate the plurality of TE elements 16 from the at least one shunt 52.

The first portion 58 and the second portion 60 can be portions of a single unitary piece, or can be separate pieces which are coupled together to form the at least one shunt 52. As shown in FIG. 3, the first and second portions 58, 60 can give the at least one shunt 52 a "T"-shaped cross-section in a plane parallel or generally parallel to the direction of fluid flow through the first fluid conduit 12. In some embodiments, the at least one shunt 52 can be in a plane perpendicular, generally perpendicular, at a non-zero angle, or non-parallel to the direction of fluid flow through the first fluid conduit 12. In other configurations, the at least one shunt 52 can have other shapes (e.g., "Y"-shaped, "I"-shaped). For example, the second portion 60 can comprise an inner section (e.g., an inner ring) configured to be in thermal communication with the first fluid conduit 12 and the first portion 58 can comprise an outer section in thermal communication with the inner section and extending in an outward (e.g., radial) direction from the inner section.

The plurality of TE elements 16 can comprise at least one first TE element 64 having a first doping type (e.g. p-type or n-type) and at least one second TE element 66 having a second doping type (e.g. p-type or n-type) that is different from the first doping type. For example, the at least one first TE element 64 can comprise only n-type thermoelectric materials and the at least one second TE element 66 can comprise only p-type thermoelectric materials, or portions of the at least one first TE element 64 can comprise both n-type and p-type materials and portions of the at least one second TE element 66 can comprise both n-type and p-type materials.

In some embodiments, the at least one first TE element 64 and the at least one second TE element 66 can each comprise one or more TE materials that are configured either to have a temperature difference applied across the one or more thermoelectric materials to produce a voltage difference across the one or more thermoelectric materials (e.g., for power generation applications) or to have a voltage difference applied across the one or more thermoelectric materials to produce a temperature difference across the one or more thermoelectric materials (e.g., for heating/cooling applications).

The at least one first TE element 64 and the at least one second TE element 66 can each comprise one or more layers of one or more materials and can have a shape (e.g., planar, cylindrical, parallelepiped, rhomboid, cubic, plug-shaped, block-shaped) configured to fit within the TE assembly 50. The at least one first TE element 64 and the at least one second TE element 66 can be coupled to or integrated with the at least one shunt 52.

In some embodiments, the plurality of TE elements 16 can be electrically isolated from at least a portion of the at least one shunt 52 while remaining in thermal communication with at least a portion of the at least one shunt 52. For example, the at least one shunt 52 can comprise one or more electrically insulating layers between the inserts 62 and the at least one portion of the at least one shunt 52, with the one or more electrically insulating layers being sufficiently thermally conductive and sufficiently electrically insulating so that the inserts 62 are in thermal communication with the at least one portion of the at least one shunt 52 but are electrically isolated from the at least one portion of the at least one shunt 52.

In some embodiments, the at least one shunt 52 can comprise at least one hole or recess 56 in the first portion 58 of the at least one shunt 52 or in another other portion of the at least one shunt 52. The TE assembly 50 can comprise at least one insert 62 partially within the at least one hole or recess 56 and in thermal communication and in electrical communication with the plurality of TE elements 16. The at least one electrically insulating element 54 can comprise at least one electrically insulating (e.g., dielectric) layer between the at least one insert 62 and the first portion 58 of the at least one shunt 52.

In some embodiments, the at least one electrically insulating layer can comprise at least one of the group consisting of: a dielectric coating on an inner surface of the at least one hole or recess, a dielectric coating on the at least one insert, a dielectric ring, paste, adhesive, tape, and a flexible membrane. The at least one electrically insulating layer can comprise (e.g. be made out of) one or more materials selected from the group consisting of: aluminum oxide, diamond, nitrides, cuprites, ceria, zirconia, diamond or aluminates. In some embodiments, the at least one electrically insulating layer or interface can be on an outer perimeter of the at least one insert 62, the inner surface of the hole or recess 56, or both. For example, the at least one electrically insulating layer can be deposited onto the outer perimeter of the insert 62 or on the inner surface of the hole or recess 56 by plasma spraying of a dielectric material (e.g., aluminum oxide, nitrides, cuprites, ceria, zirconia, diamond, aluminates or any other dielectric coating with breakdown voltage higher than voltage at which TE device operates). In some embodiments, the at least one electrically insulating layer or interface can be formed into a sleeve. In other embodiments, the at least one electrically insulating layer can be in the form of a paste, adhesive or tape.

The at least one insert 62 can be in electrical communication with both the at least one first and second TE elements 64, 66 and can be positioned between the at least one first TE element 64 and the at least one second TE element 66. In some embodiments, the at least one insert 62 is in thermal communication with the at least one shunt 52 and the at least one first and second TE elements 64, 66. In some embodiments, the at least one shunt 52 can comprise at least one plate configured to fit within the at least one hole or recess 56.

In some embodiments, the insert 62 can be configured to fit within the hole or recess 56 (e.g., extending through the hole 56), and the insert 62 can be sandwiched between the at least one first TE element 64 and the at least one second TE element 66. The at least one insert 62 can be in thermal and electrical communication with the at least one first TE element 64 and the at least one second TE element 66 to which it is mechanically coupled, such that the at least one first TE element 64 is in series electrical communication with the at least one second TE element 66, and there is a thermal path from the second portion 60, through the insert 62 of the first portion 58, to the at least one first TE element 64 and to the at least one second TE element 66.

As shown in FIG. 3, in some embodiments, the at least one first TE element 64 can be positioned on a first side of the at least one shunt 52 and the at least one second TE element 66 can be positioned on a second side of the at least one shunt 52 such that at least a portion of the at least one shunt 52 is sandwiched between the at least one first TE element 64 and the at least one second TE element 66. For example, at least a portion of the first portion 58 of the at least one shunt 52 (e.g., the insert 62) is sandwiched between the at least one first TE element 64 and the at least one second TE element 66. The at least one first TE element 64 can be directly mechanically coupled to the at least one shunt 52, or the TE assembly 50 can comprise an intervening material or structure (e.g., a bonding material, insert, and/or dielectric layer) between the at least one first TE element 64 and the at least one shunt 52. Similarly, the at least one second TE element 66 can be directly mechanically coupled to the at least one shunt 52, or the TE assembly 50 can comprise an intervening material or structure (e.g., a bonding material, insert, and/or dielectric layer) between the at least one second TE element 66 and the shunt 52.

For example, as schematically illustrated by FIG. 3, the at least one insert 62 can comprise a copper disk or cylinder sandwiched between a corresponding first TE element 64 (e.g., cylindrical pellet) mounted on (e.g. mounted to, bonded, soldered, sintered to or compressed to) the insert 62 and a corresponding second TE element 66 (e.g., cylindrical pellet) mounted on (e.g. mounted to, bonded, soldered, sintered to or compressed to) the insert 62. A plurality of holes 56 and inserts 62 can be distributed generally symmetrically along the first portion 58. Other shapes (e.g., square, triangular, oval, polygonal, irregular) and distributions (e.g., asymmetric, non-symmetric) of the holes 56 and the inserts 62 can also be used. Each of the inserts 62 can be placed within a corresponding hole 56 and mechanically coupled to the electrically insulating element 54 surrounding the hole 56 (e.g., by brazing, welding, or using adhesive).

In some embodiments, the at least one insert 62 can comprise the same material or a different material than the at least one shunt 52. The at least one shunt 52 can be made of material with a coefficient of thermal expansion (CTE) lower than that of the at least one insert 62. This configuration can allow for the at least one insert 62 to stay in good thermal contact during heating. This configuration can reduce the effect of thermal expansion and reduce overall growth of the TE assembly 50.

In some embodiments, the at least one shunt 52 can be made of material with a CTE higher than that of the at least one insert 62. For example, the at least one shunt 52 can be made of aluminum alloy and the at least one insert 62 can be made from copper alloy. In this configuration, the thermal interface resistance can increase as temperature increases. In this way, it can be possible to protect a sensitive TE assembly from overheating. Once the shunt temperature reached its critical temperature, the interface resistance would increase and reduce heat flow through the shunt. By reducing the heat flow, temperature of the shunt would drop and TE material would be protected from overheating.

In some embodiments, the at least one shunt 52 can be made from lighter material then the at least one insert 62 in order to reduce the weight of the TE assembly 50. In some embodiments, the at least one shunt 52 can be made of less thermally conductive material (e.g. coefficient of thermal conductivity), for example stainless steel, and the at least one insert 62 can be made of more thermally conductive material (e.g. coefficient of thermal conductivity), for example copper or nickel. This configuration would allow for engineering of thermal conductance. For example, the thermal path through the at least one shunt 52 can be maintained short while the thermal path through the more thermally conductive insert 62 can be longer, therefore reducing overall conductance.

Figure 4:
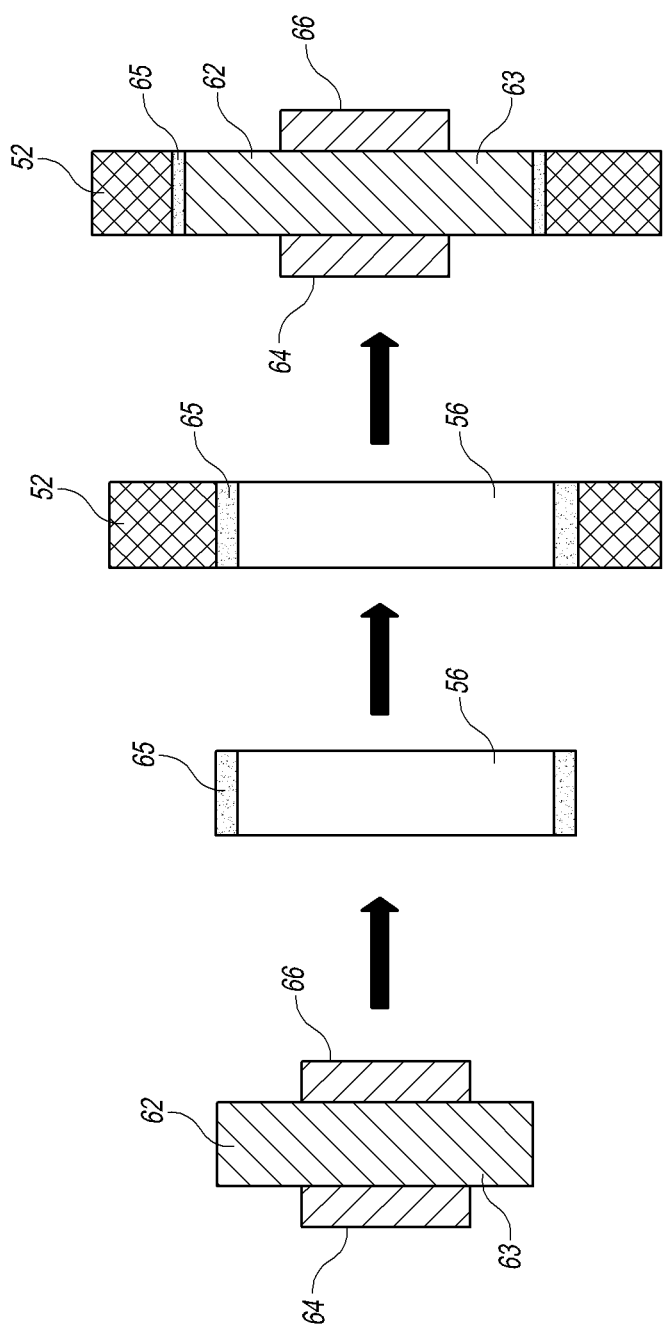
FIG. 4 schematically illustrates an example assembly sequence for the TE assembly of FIG. 3 in accordance with certain embodiments herein.

FIG. 4 schematically illustrates an assembly sequence for the fabrication of a TEG shunt 52 with electrically isolating inserts 62. Each insert 62 is in thermal communication with the at least one shunt 52 but is electrically isolated from the at least one shunt 52. The insert 62 can comprise an electrically conductive portion 63 and an electrically insulating portion 65 (e.g., one or more dielectric layers, spacers, or ring). The electrically conductive portion 63 can be mounted to the TE elements 64, 66 (e.g., by bonding, soldering, sintering, compressing) to be in thermal and electrical communication with the TE elements 64, 66, and the electrically insulating portion 65 can be fitted, mounted, or deposited on either the electrically conductive portion or the inner surface of the hole or recess 56 of the at least one shunt 52. The electrically conductive portion 63 can then be inserted in the hole or recess 56 with the electrically insulating portion 65 positioned between the electrically conductive portion 63 and the inner perimeter of the hole or recess 56 of the at least one shunt 52. In some embodiments, it is also possible to attach the insert 62 to the at least one shunt 52 by means of bonding, gluing or bolting without loss of function of the electrically insulating portion 65.

Figure 5A:
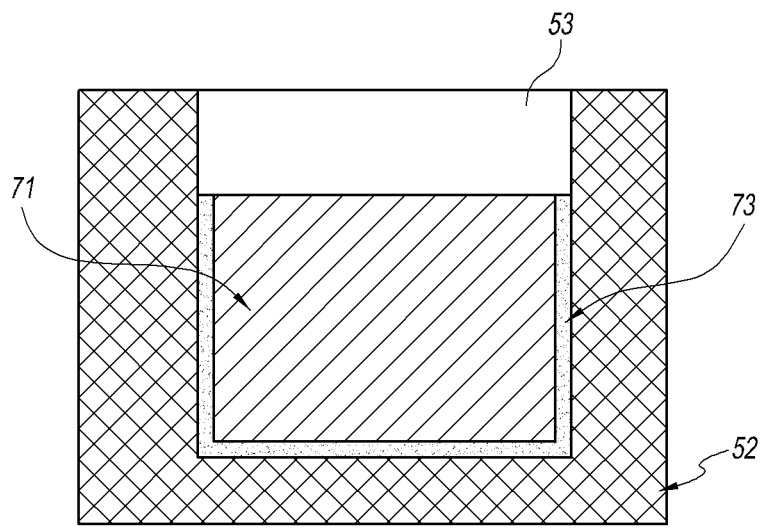
FIGS. 5A-5B schematically illustrate an example TE assembly having channels formed on the shunt in accordance with certain embodiments herein.
Figure 5B:
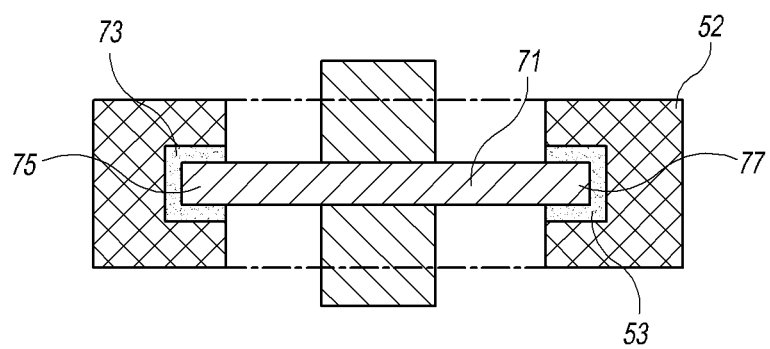

In some embodiments, to allow easier assembly, it is possible to form channels, slots, or recesses on the shunt 52. These channels, slots, or recesses can be used to position electrical inserts 71 with dielectric coating or interfaces 73 by sliding them into their position. An example of this configuration is shown in a side view of such a configuration in FIG. 5A. An insert can be positioned within the channel, slot or recess 53 of the shunt 52. A top view of such a configuration in FIG. 5B schematically illustrates an electrical insert 71 having two ends 75, 77, with both ends 75, 77 positioned in a respective channel 53 of a shunt 52.

Figure 6:
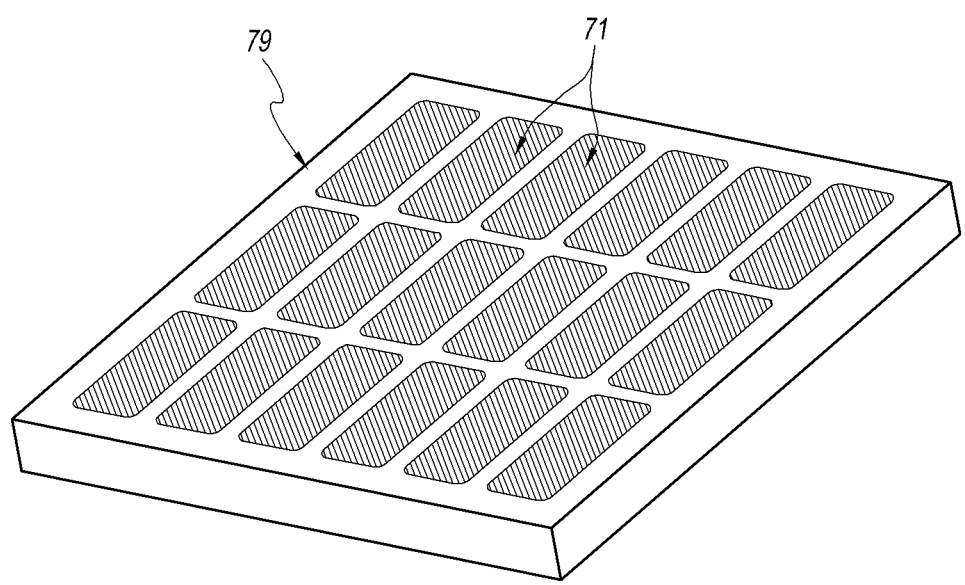
FIG. 6 schematically illustrates an example configuration in which an array of electrical inserts with dielectric coatings is placed in a flat plate in accordance with certain embodiments herein.

FIG. 6 shows a schematic view of a configuration in which an array of electrical inserts 71 with electrically insulating coatings is placed in a flat plate 79. Materials of the flat plate 79 can be selected using the same criteria as materials for the already mentioned shunt 52.

In some embodiments, such a TE assembly can increase voltage and reduce current to allow for smaller heating losses (Joules) and smaller, lower mass wires to be used for external connections. More efficient power converters can be used and/or the power converter cost, mass and efficiency reduction can be eliminated.

Assembly with Inert Gas Encapsulation

In certain embodiments, TE elements in general are not operated in air but instead in an inert gas atmosphere for long and reliable operation. TE assemblies discussed below may be encapsulated after all rings and/or shunts are assembled. Encapsulation can avoid a large number of liquid connections which otherwise could potentially compromise reliable functioning of the device. The present application discloses example systems and methods of manufacturing individual hot rings and/or shunts with integrated fins and inert gas encapsulation. The present application also discloses example systems and methods of integrating at least one liquid cooled block outside of the inert gas encapsulation.

Figure 7A:
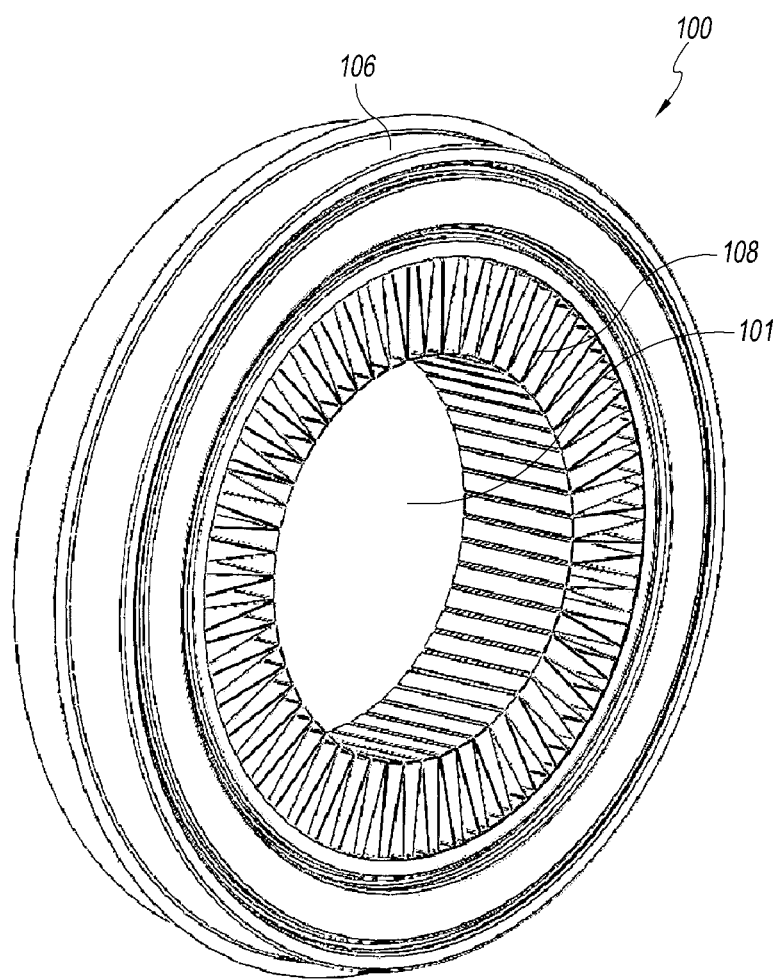
FIG. 7A schematically illustrates an example TE assembly having a housing or shells in accordance with certain embodiments herein.
Figure 7B:
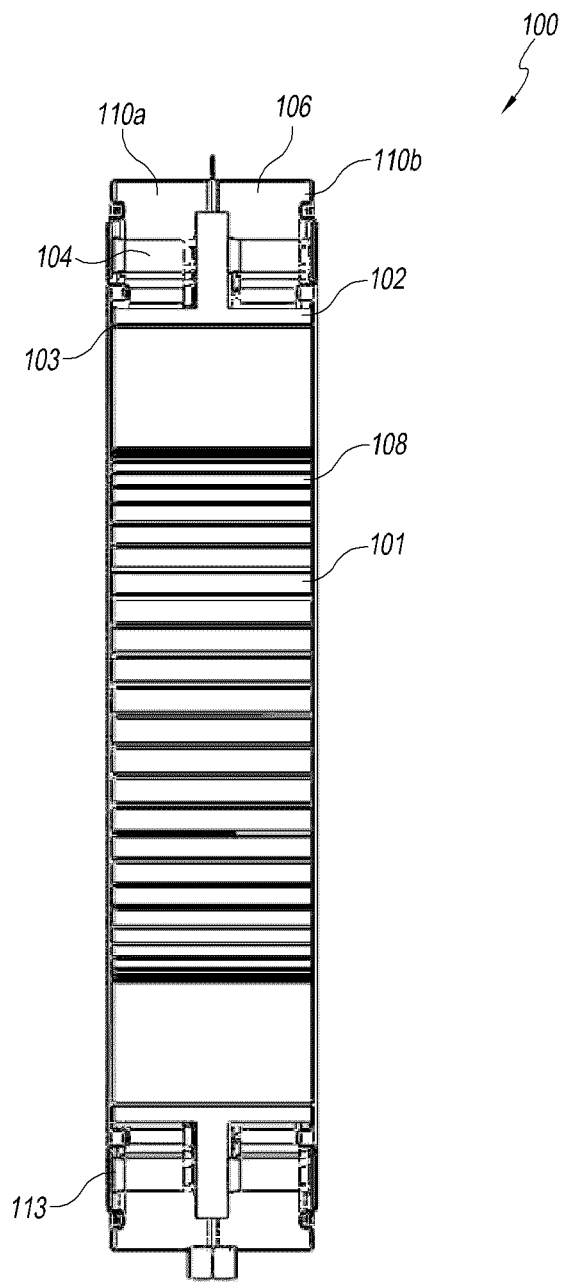
FIG. 7B schematically illustrates another partial section view of the example TE assembly of FIG. 7A in accordance with certain embodiments herein.
Figure 8:
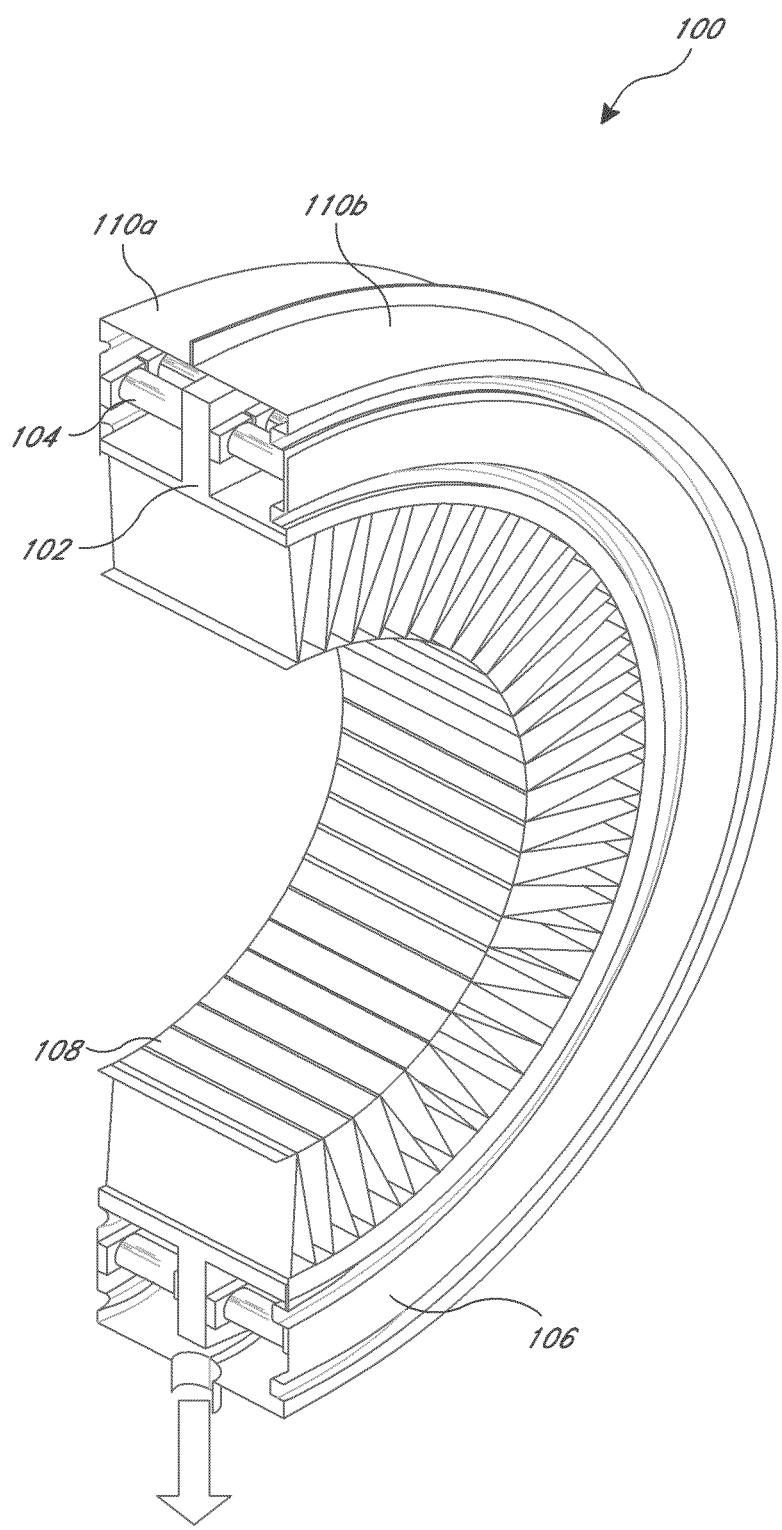
FIG. 8 schematically illustrates a partial section view of the example TE assembly of FIG. 7A in accordance with certain embodiments herein.

FIG. 7A schematically illustrates a perspective view of an example TE assembly 100 utilizing gas encapsulation and FIG. 7B is a cross-sectional view of the example TE assembly 100 of FIG. 7A. FIG. 8 schematically illustrates a partial section view of the example TE assembly 100 of FIG. 7A. The TE assembly 100 can comprise at least one shunt 102 configured to allow a first fluid to flow through a region 101 at least partially bounded by the at least one shunt 102. The at least one shunt 102 is in thermal communication with the first fluid. The TE assembly 100 further comprises a plurality of TE elements 104 in thermal communication with and distributed along at least one surface of the at least one shunt 102. The TE assembly 100 can comprise a housing 106 in thermal communication with the plurality of TE elements 104. The plurality of TE elements 104 are enclosed by the housing 106 and the at least one shunt 102.

In some embodiments, the at least one shunt 102 is annular and has an inner surface 103 that encircles the first fluid flowing through the at least one shunt 102. The plurality of TE elements 104 can also encircle the first fluid flowing through the at least one shunt 102.

In some embodiments, the TE assembly 100 can comprise a plurality of fins 108 configured to allow the first fluid to flow through the plurality of fins 108. The plurality of fins 108 can be mounted to the inner surface 103 of the at least one shunt 102 or a perimeter of the at least one TE assembly 100.

Figure 9:
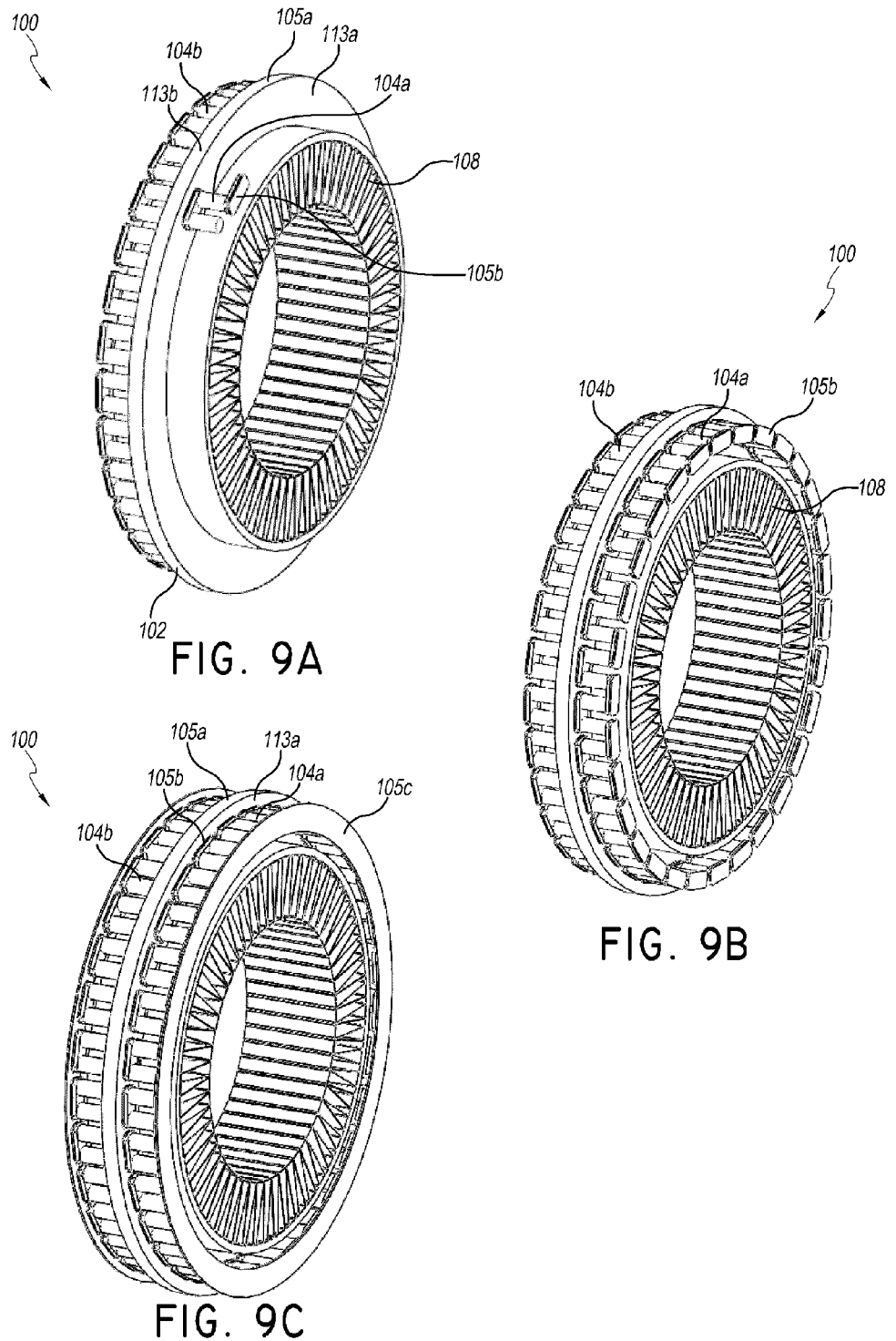
FIGS. 9A-9C schematically illustrate an example assembly sequence of the TE assembly of FIG. 7A in accordance with certain embodiments herein.

FIGS. 9A-9C illustrate an example assembly sequence of the example TE assembly 100 of FIG. 7A comprising a plurality of fins 108 as discussed above. A first plurality of TE elements 104a can be mechanically coupled to a first surface 113a of an outer portion 105a of the at least one shunt 102 and a second plurality of TE elements 104b can be mechanically coupled to a second surface 113b of the outer portion 105a and facing opposite to the first surface 113a. For example, the first plurality of TE elements 104a can be configured in a "Stonehenge" configuration around the outer portion 105a with shunt portions 105b between the TE elements 104a and the outer portion 105a, in electrical communication with the TE elements 104a, and electrically insulated from the outer portions 105a, and shunt portion 105c on the other side of the TE elements 104a, thereby placing the TE elements 104a in series electrical communication with one another. Similarly, the second plurality of TE elements 104b can be in series electrical communication with one another. One or more rings or shunt portions 105b can be mechanically coupled to the first plurality of TE elements 104a and the second plurality of TE elements 104b as shown in FIG. 9C (e.g., by shunts portion 105b in electrical communication with the TE elements 104a and electrically insulated from shunt portion 105c). In certain embodiments, the TE assembly 100 illustrated in FIG. 9C can then be encapsulated by two half shell portions 110a, 110b to form the housing 106 around the TE assembly 100, thereby producing the structure shown in FIG. 7A. The two half shell portions 110a, 110b of the housing 106 can be bonded to the TE assembly 100 as described in more detail below.

In certain embodiments, the housing 106 and the at least one shunt 102 encapsulates the plurality of TE elements 104. For example, in one embodiment, encapsulation of the TE assembly 100 can be achieved by placing two half shell portions 110a, 110b (e.g. the housing 106) around the at least one shunt 102 and bonding them to the at least one shunt 102 (e.g., on the inner diameter of the shells 110a, 110b) and to each other (e.g., on the outer diameter 114), as shown in FIG. 7B. Shell portions 110a, 110b can be bonded by welding, brazing or soldering if device is designed for low temperature applications. Shell portions 110a, 110b can be made, for example by stamping from low thermally or electrically conducting materials such as steel.

The housing 106 can further comprise contours configured to flex in response to motion of portions of the TE assembly 100. The TE assembly 100 can further comprise pads 113 mechanically coupled to the plurality of TE elements 104 and configured to yield in response to motion of portions of the TE assembly 100. The motion of portions of the TE assembly 100 can be due to (i) thermal expansion or contraction within the TE assembly 100 and/or (ii) mechanical shocks to the TE assembly 100 which cause relative motion between components of the TE assembly 100.

In some embodiments, the TE assembly 100 further comprises pads or grease in thermal communication with the plurality of TE elements 104 and configured to allow sliding of the plurality of TE elements 104 in an outward direction generally away from the region 101 at least partially bounded by the at least one shunt 102, in response to motion of portions of the TE assembly 100. For example, as shown in FIG. 7B, the TE assembly 100 can comprise compliant pads 113 mechanically coupled to the plurality of TE elements 104 (e.g., made of indium or tin foil) such that the TE elements 104 can slide in response to thermal expansion.

In certain embodiments, the shell portions may be necessary to provide axial pressure on the plurality of TE elements 104. The bonding of the shell portions to the at least one shunt 102 and to one another can provide axial pressure on the plurality of TE elements 104.

In some embodiments, the shell portions can comprise geometric features to allow for thermal expansion (e.g., the shell portions can have features which will allow them to follow the thermal expansion of the at least one shunt 102 and the plurality of TE elements 104). For example, FIG. 8 illustrates a partial cross section which shows concentric impressions. These features can allow the shell portions to flex as the at least one shunt 102 grows due to thermal expansion and therefore reduce stress on the plurality of TE elements 104.

As discussed above, stress on the plurality of TE elements 104 can be reduced by using compliant pads 113 which can yield under pressure and reduce the load on the plurality of TE elements 104. In some embodiments, stress on the plurality of TE elements can be reduced by using low friction compliant pads 113 which would allow sliding of the plurality of TE elements 104 in a radial direction and reduce the load on the plurality of TE elements 104. Stress on the plurality of TE elements 104 can also be reduced by using thermal grease at the interface between the cold shunt and shell surface which would allow sliding of TE elements in a radial direction and reduce the load on the TE elements.

Figure 10:
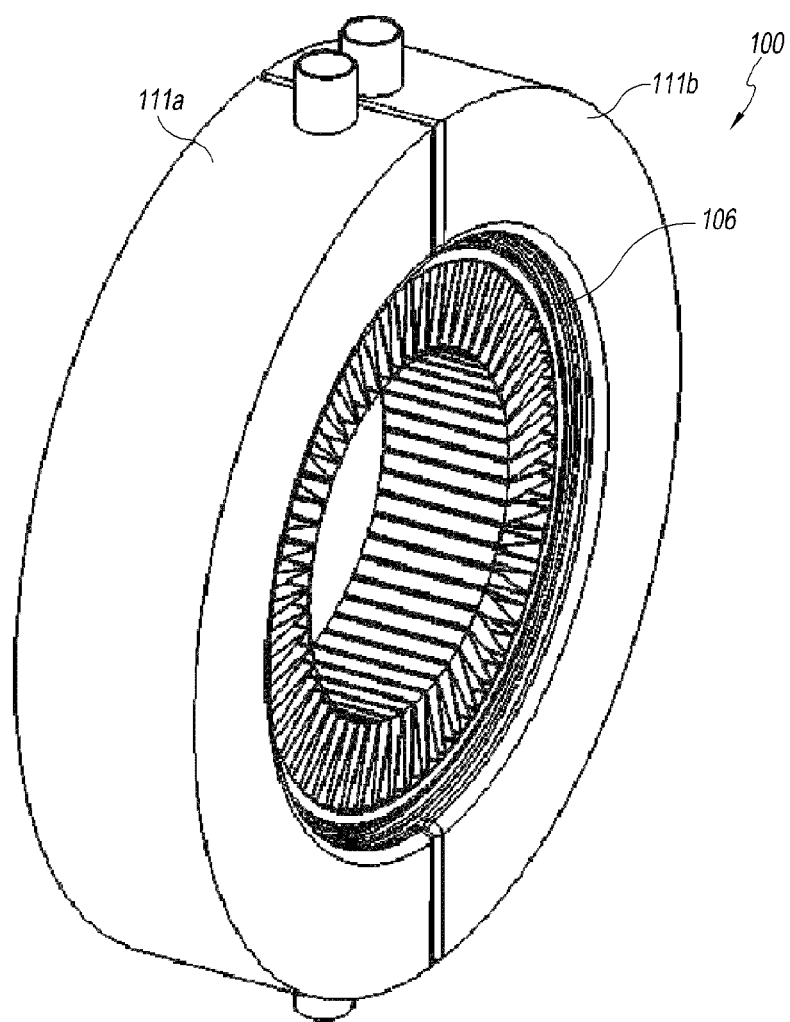
FIG. 10 schematically illustrates the example TE assembly of FIG. 7A having cooling rings in accordance with certain embodiments herein.

In some embodiments, the TE assembly 100 can further comprise at least one second shunt in thermal communication with a second fluid having a second temperature different from a first temperature of the first fluid. For example, the at least one second shunt can comprise the housing 106, as shown in FIG. 7B. The at least one second shunt can further comprise at least one fluid conduit containing the second fluid Cooling of encapsulated TE assemblies 100 can be achieved by liquid with a liquid loop outside the encapsulated volume. FIG. 10 shows an example where two cold half rings 111a, 111b surround the housing 106 forming a fluid conduit outside the housing 106. The two machined cold half rings 111a, 111b can be sweat fitted together to form the fluid conduit. In some embodiments, the two cold half rings 111a, 111b can be mechanically connected to cold shell surfaces of the housing 106. For example, the cold rings 111a, 111b can be coupled to the cold shell surfaces (e.g. the housing 106) by bolting or brazing them to the cold shell surfaces. A cooling gas can flow through the fluid conduit formed by the two cold half rings 111a, 111b which can be in thermal communication with the housing 106 to provide cooling for the TE assembly 100. Certain embodiments disclosed herein also allow the liquid loop (e.g., fluid conduit formed by the two cold half rings 111a, 111b) and removal of liquid to be separate from the encapsulated inert gas volume. The liquid loop is separate from the encapsulated inert gas and flow (e.g., removal) of the liquid is separate from the encapsulated gas.

Segmented Assembly with Rotatably Coupled Portions

In certain embodiments, the copper rings or cylindrical TEGs that are used to conduct heat outward from a cylindrical heat exchanger to the TE elements of a power generation device can be split or divided into several individual segments or TE sub-assemblies, as discussed above. These segments can be connected via electrically insulated pins, rods, or other fasteners to recreate a continuous ring that takes advantage of the hoop stress created by the different coefficients of thermal expansion between the heat exchanger and the ring of segments (e.g., converting the solid or split ring into a linked chain). By electrically isolating the individual segments from one another, the single parallel circuit that would be created by a solid ring can be separated into an appropriate number of individual circuits that can then be wired in series to increase the operating voltage of the device, assembly or device to the desired level.

Figure 11A:
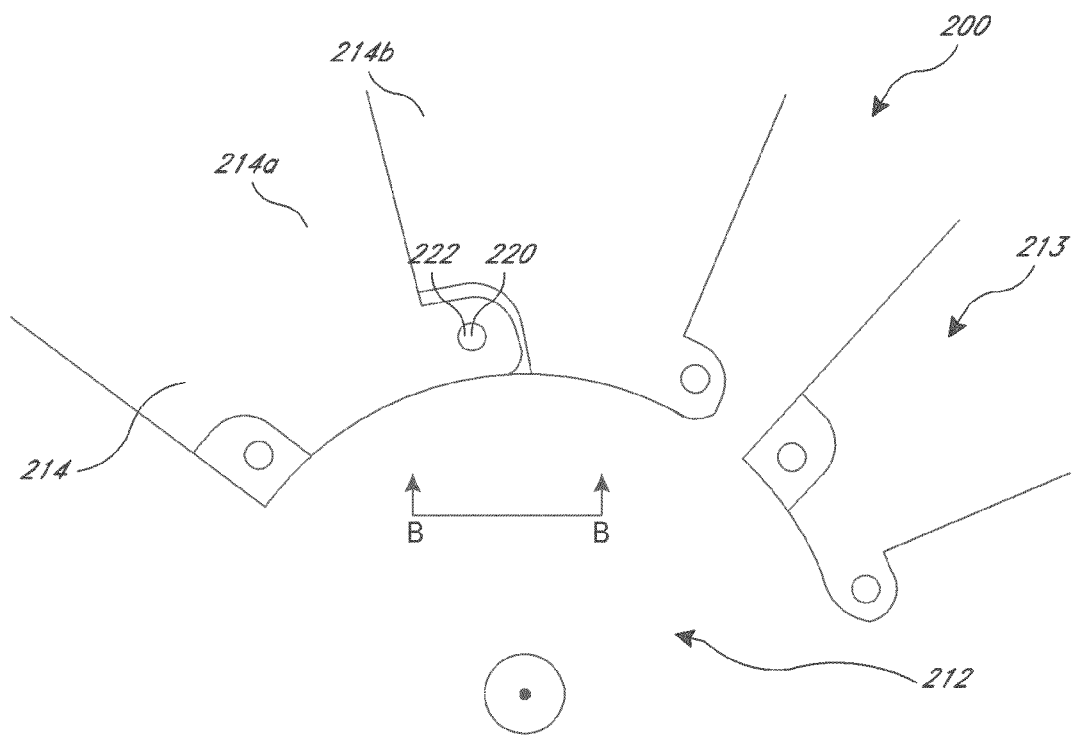
FIGS. 11A-11B schematically illustrate an example TE assembly having TE sub-assemblies rotatably coupled together in accordance with certain embodiments herein.
Figure 11B:
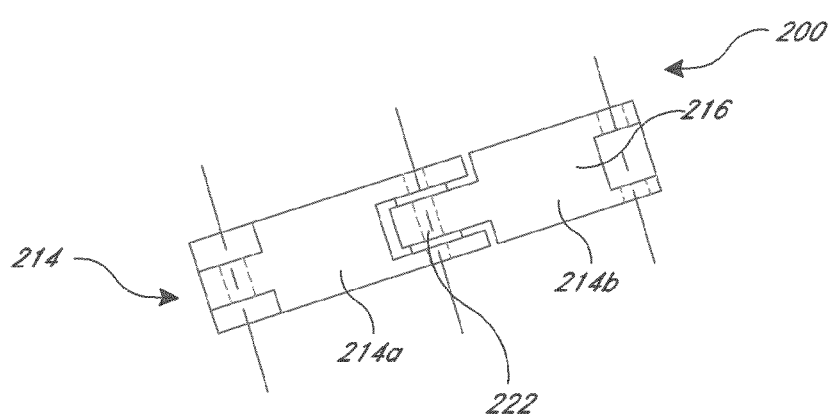

FIGS. 11A-11B schematically illustrate an end view and partial section view respectively, of an example thermoelectric (TE) assembly 200 having one or more of the same features as any of the TE assemblies described above. The TE assembly 200 is configured to be mounted in thermal communication with a fluid conduit 212. The TE assembly 200 can comprise a plurality of TE sub-assemblies 214 with each TE sub-assembly 214 comprising at least one TE element (not shown) and at least one shunt 216 in thermal communication with and mechanically coupled to the at least one TE element. The at least one shunt 216 is configured to be mounted in thermal communication with the fluid conduit 212. The TE assembly 200 can further comprise at least one coupler 220 configured to mechanically couple the plurality of TE sub-assemblies 214 together such that adjacent TE sub-assemblies of the plurality of TE sub-assemblies 214 can rotate relative to one another.

In some embodiments, the at least one coupler 220 can comprise at least one hinge 222 mechanically coupling a first TE sub-assembly 214a to a second TE sub-assembly 214b of the plurality of TE sub-assemblies 214. The first TE sub-assembly 214a can be adjacent to the second TE sub-assembly 214b. In some embodiments, the plurality of TE sub-assemblies 214 can form a chain in which adjacent TE sub-assemblies 214 are rotatably mechanically coupled together.

In some embodiments, the at least one hinge 222 can comprise a first portion of the first TE sub-assembly 214a and a second portion of the second TE sub-assembly 214b. The at least one hinge 222 can comprise at least one fastener 224 configured to mechanically couple the second portion of the second TE assembly 214b to the first portion of the first TE sub-assembly 214a such that the first TE sub-assembly 214a and second TE-sub assembly 214b can rotate relative to one another. In certain embodiments, the TE assembly 200 undergoes mechanical loading against the conduit 212 upon thermal expansion of the conduit 212.

In some embodiments, the plurality of TE sub-assemblies 214 are electrically isolated from one another. As discussed above, electrically insulating elements such as spacers or rods can be used to electrically isolate the TE sub-assemblies 214. In some embodiments, the coupler 220 can be used with non-conductive spacers, coatings, or washers for electric isolation.

Figure 12A:
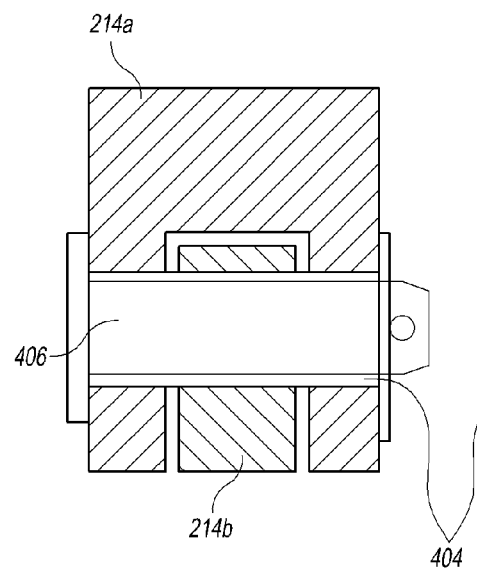
FIGS. 12A-12D schematically illustrate various mechanisms or methods for coupling the TE sub-assemblies of FIGS. 11A-11B in accordance with certain embodiments herein.
Figure 12C:
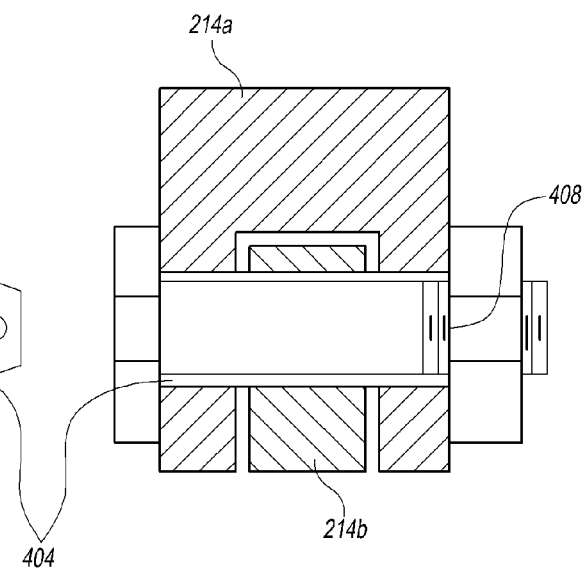
Figure 12B:
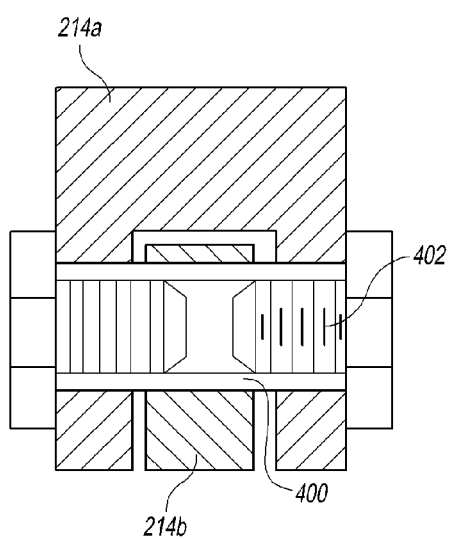
Figure 12D:
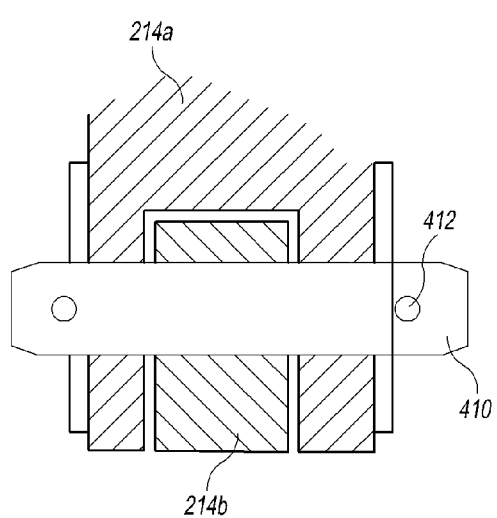

For example, as illustrated in FIGS. 12A-2D, there are several methods, manners or structures that can be used to connect TE ring segments or sub-assemblies 214. These couplers 220 can include, but are not limited to: the use of a non-conductive ceramic spacer 404 and a metal pin 406, as shown in FIG. 12A, a non-conductive ceramic 400 stand-off with a threaded fastener 402, as shown in FIG. 12B, the use of a non-conductive ceramic spacer 404 and a threaded fastener 408, as shown in FIG. 12C, the use of a non-conductive ceramic rod 410 held in position by cotter pins 412, as shown in FIG. 12D, a metal pin or fastener can be coated with a non-conductive ceramic and/or coating the inner diameter of the holes of the link and using a pin or threaded fastener, etc. In some embodiments, washers (e.g., ceramic or mica) can be used to electrically insolate sub-assemblies 214.

In some embodiments, a TE system 230 can comprise a plurality of the TE assemblies 200, wherein the plurality of TE sub-assemblies 214 of each TE assembly 200 of the plurality of TE assemblies, extends at least partially around one or more perimeters of the fluid conduit 212.

Assembly with Triangular Shunts

In some embodiments, TE elements can be connected in series around a ring (e.g., along a perimeter) of a cylindrical TEG device or assembly and each ring can be electrically connected to an adjacent ring in series.

FIG. 13A shows one example of a TE assembly 500 having TE elements connected electrically with one another in series around a ring. This type of configuration can allow the buildup of voltage on a ring and subsequent rings in the axial direction can be connected electrically in series to continue the build up of voltage.

The TE assembly 500 can comprise at least one first TE element 502 and at least one second TE element 504. The TE assembly 500 can further comprise a first plurality of shunts 506 wherein each shunt of the first plurality of shunts 506 can comprise a first surface portion 508 configured to be in thermal communication with at least a first fluid conduit 510, a second surface portion 512, and a third surface portion 514. The second surface portion 512 and the first surface portion 508 can define a first non-zero angle therebetween and the third surface portion 514 and the first surface portion 508 can define a second non-zero angle therebetween. The TE assembly 500 can further comprise a second plurality of shunts 516 wherein each shunt of the second plurality of shunts 516 can comprise a fourth surface portion 518, a fifth surface portion 522, and a sixth surface portion 524. The fifth surface portion 522 and the fourth surface portion 518 can define a third non-zero angle therebetween and the sixth surface portion 524 and the fourth surface portion 518 can define a fourth non-zero angle therebetween.

In certain embodiments, each shunt of the first and second plurality of shunts 506, 516 can comprise more than three surfaces or less than three surfaces. In some embodiments, the shunts can have a triangular cross-section (e.g., as shown in FIG. 13A), polygon, rectangular, etc. Each shunt of the first and second plurality of shunts 506, 516 can have the same or different number of surfaces.

In some embodiments, the at least one first TE element 502 can be between and in thermal communication with the second surface portion 512 of a first shunt 513 of the first plurality of shunts 506 and the fifth surface portion 522 of a second shunt 515 of the second plurality of shunts 516. The at least one second TE element 504 can be between and in thermal communication with the sixth surface portion 524 of the second shunt 515 of the second plurality of shunts 516 and the third surface portion 534 of a third shunt 517 of the first plurality of shunts 506.

In some embodiments, a sum of the first non-zero angle, the second non-zero angle, and a non-zero angle between the second surface portion 512 and third surface portion 514 equals 180 degrees. In some embodiments, a sum of the third non-zero angle, fourth non-zero angle and a non-zero angle between the fifth surface portion 522 and sixth surface portion 524 equals 180 degrees. In other embodiments, the first non-zero angle is substantially equal to the second non-zero angle. The third non-zero angle can be substantially equal to the fourth non-zero angle. The first, second, third and fourth non-zero angles can be substantially equal to one another. In some embodiments, the first, second, third and fourth non-zero angles are acute.

The TE assembly 500 can further comprise at least one third TE element 530 that is between and in thermal communication with the second surface portion 532 of the third shunt 517 of the first plurality of shunts 506 and the fifth surface portion 542 of a fourth shunt 519 of the second plurality of shunts 516. In some embodiments, the TE assembly 500 can comprise at least one third TE element 530 that is located between and in thermal communication with the third surface portion 514 of the first shunt 513 of the first plurality of shunts 506 and the sixth surface portion 544 of a fourth shunt 519 of the second plurality of shunts 516.

In some embodiments, the at least first fluid conduit 510 can comprise a first tube having a generally circular cross-section in a plane perpendicular to the first fluid conduit 510. The first plurality of shunts 506 can be configured to extend along a perimeter of the first fluid conduit 510 in the plane perpendicular to the first tube and can be in thermal communication with a curved outer wall of the first fluid conduit 510.

The second plurality of shunts 516 can be configured to be in thermal communication with at least a second fluid conduit 526 that can comprise a plurality of second tubes. Each shunt of the second plurality of shunts 516 is in thermal communication with at least one second tube 531 of the plurality of second tubes 531. For example, as shown in FIG. 13A, a second tube 531 can go through (e.g., through the center) each shunt of the second plurality of shunts 516 in order to further conserve space. The first fluid conduit 510 can contain a fluid having a first temperature and the plurality of second tubes 531 can contain a second fluid having a second temperature different from the first temperature. In some embodiments, each shunt of the second plurality of shunts 516 can comprise a hole 533 configured to have the second fluid flow through the at least one hole, as shown in FIG. 13A.

In certain embodiments, the fourth surface portion 518 of each shunt of the second plurality of shunts 516 can be mechanically coupled to at least one elongate element 521 having a cross-section in the plane perpendicular to the first fluid conduit 510 that comprises at least an arc of a circle that is substantially concentric to the generally circular cross-section of the first fluid conduit 510, as shown in FIG. 13A. The at least one elongate element 521 can comprise a band configured to apply a force on the fourth surface portion 518 of each shunt of the second plurality of shunts 516 wherein the force is in a generally radial direction towards the first fluid conduit 510. For example, the band can be an electrically isolated band that compresses the shunts against the hot first fluid conduit 510 (e.g., cylinder). The band can compress the shunts against the hot side of the TE assembly 500, and the band can be made of more compliant materials. TE elements can be kept in compression by the electrically isolated band.

A TE system 550 can comprise a plurality of TE assemblies 500 (e.g., 500a, 500b) as discussed above. Adjacent TE assemblies can extend along perimeters of the first fluid conduit 510 that are parallel or generally parallel to one another.

In some embodiments, the TE system 550 can comprise a plurality of compliant members 552 (e.g., elastic springs) between adjacent TE assemblies 500 as illustrated in FIG. 13B to keep the TE elements in compression. For example, spring mechanisms can be a part of an electrically isolated band to provide electrical and thermal contact that varies as the hot tube or conduit heats up and cools down. Certain such embodiments do not use any additional springs to keep the TE elements in compression.

The TE system 550 can further comprise a plurality of elongate elements 521 such as those discussed above (e.g. a plurality of bands electrically isolated from the plurality of TE assemblies). Each elongate element 521 is configured to press a corresponding TE assembly 500 against an outer wall of the first fluid conduit 510. These elongate elements, can further comprise a plurality of springs positioned between adjacent TE assemblies 500.

Electrically Insulating Layer on Heat Exchanger

Figure 14A:
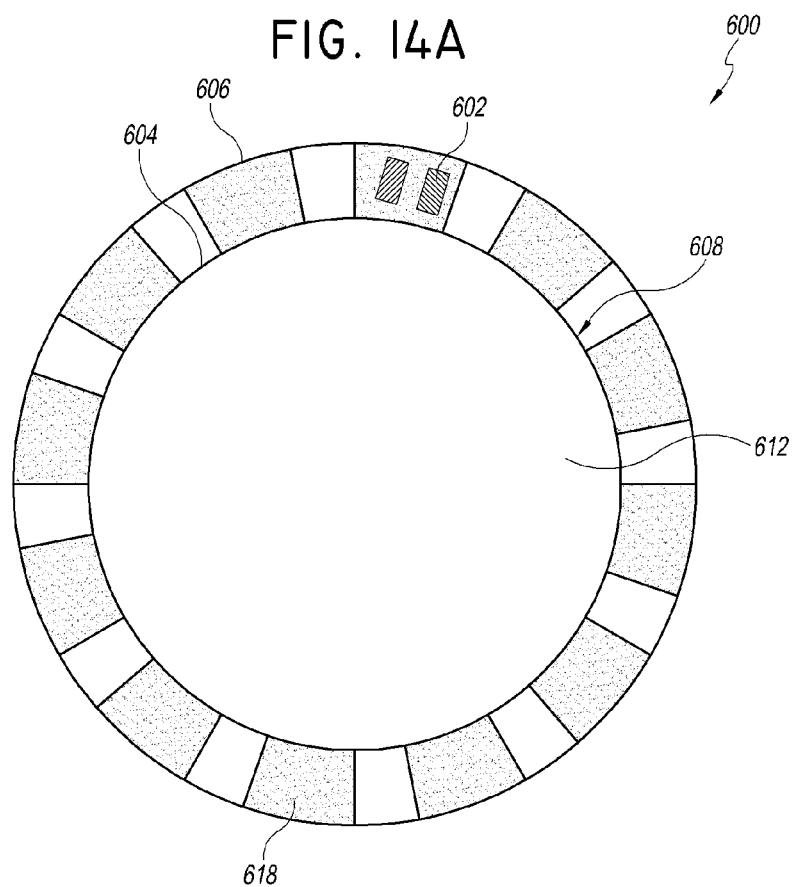
FIGS. 14A-14B schematically illustrate an example TE assembly having at least one electrically insulating layer in accordance with certain embodiments herein.
Figure 14B:
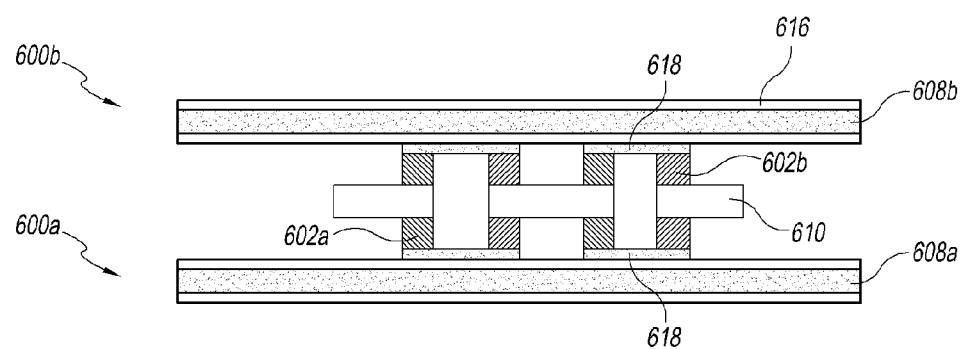

In some embodiments, as illustrated schematically in FIGS. 14A-14B, a TE assembly 600 can be configured to be in thermal communication with a first fluid at a first temperature. The TE assembly 600 can comprise a first plurality of TE elements 602. The TE assembly 600 can comprise at least one first heat exchanger 608 comprising a first portion 604 substantially surrounding a region 612 containing the first fluid, wherein the at least one first heat exchanger 608 comprises at least one second portion 606 extending in a direction away or generally away from the region.

The TE assembly 600 can further comprise at least one second heat exchanger 610 configured to be in thermal communication with and mechanically coupled to at least one fluid conduit 614 containing a second fluid at a second temperature different from the first temperature. The first plurality of TE elements 602 can be between and in thermal communication with the at least one second portion 606 of the at least one first heat exchanger 608 and the at least one second heat exchanger 610. The TE assembly 600 can further comprise at least one electrically insulating layer 616 between the at least one second portion 606 and the first plurality of TE elements 602.

In some embodiments, the region 612 is within a tubular or generally tubular fluid conduit, and the first portion 604 is mechanically coupled to an outer wall of the tubular or generally tubular fluid conduit along a perimeter of the tubular or generally tubular fluid conduit. The at least one second portion 606 can extend in a radial direction away from the outer wall of the tubular or generally tubular fluid conduit. In some embodiments, the first portion 604 comprises a ring surrounding the tubular or generally tubular fluid conduit.

In some embodiments, the at least one electrically insulating layer 616 comprises a dielectric coating on the at least one second portion 606 of the at least one first heat exchanger 608. In certain embodiments, the first plurality of TE elements 602 are positioned at a first side 609 of the at least one second portion 606 such that the TE elements 602 adjacent to one another along a direction parallel or generally parallel to the first side 609 alternate between a first doping type (e.g. p-type or n-type) and a second doping type (e.g. p-type or n-type) different from the first doping type.

The TE assembly 600 can further comprise a plurality of shunts 618 that are electrically conductive and in electrical communication with the first plurality of TE elements 602. In some embodiments, at least a portion of the plurality of shunts 618 is between the at least one first heat exchanger 608 and the first plurality of TE elements 602. At least a portion of the at least one electrically insulating layer 616 electrically isolates the at least a portion of the plurality of shunts 618 from the at least one first heat exchanger 608. For example, the electrically insulating layer 616 or coating can be deposited or sprayed either on the surface of the at least one first heat exchanger 608 or on an inside surface of the shunt 618.

The electrically insulating layer 616 can be deposited on a flat surface of the at least one first heat exchanger 608, or shunt 618 as shown in FIGS. 14A-14B. An electrically insulating layer (e.g., dielectric coating) at this interface can enable series connection of at least some of the TE elements 602 along the at least one first heat exchanger 608 and can increase the voltage proportional to the number of series connections. For example, as shown in FIG. 14B, an electrical current can flow in series through at least some of the TE elements 602a along the at least one first heat exchanger 608a of at least one TE assembly 600a Likewise, an electrical current can flow in series through at least some of the TE elements 602b along the at least one first heat exchanger 608b of at least one TE assembly 600b.

On the hot side (e.g., side in thermal communication with the first heat exchanger 608), TE elements 602 can be electrically connected using conductive pads, for example copper or nickel shunts 618. On their cold side (e.g. side connected to a second heat exchanger not in direct thermal communication with region 612), the TE elements 602 are electrically connected using cold shunts or second heat exchangers 610. Cold shunts, for example, can have integrated dielectric coating which would enable them to electrically separate or isolate TE elements on two adjacent rings. Cold shunts or heat exchangers can be used without dielectric coating allowing TE elements 602 on the two adjacent rings to be electrically connected; this concept is shown in FIGS. 14A-14B. Ring to ring, shunt to shunt, or heat exchanger to heat exchanger electrical connection can be achieved on the cold side, hot side or on any combination of these two.

Figure 15A:
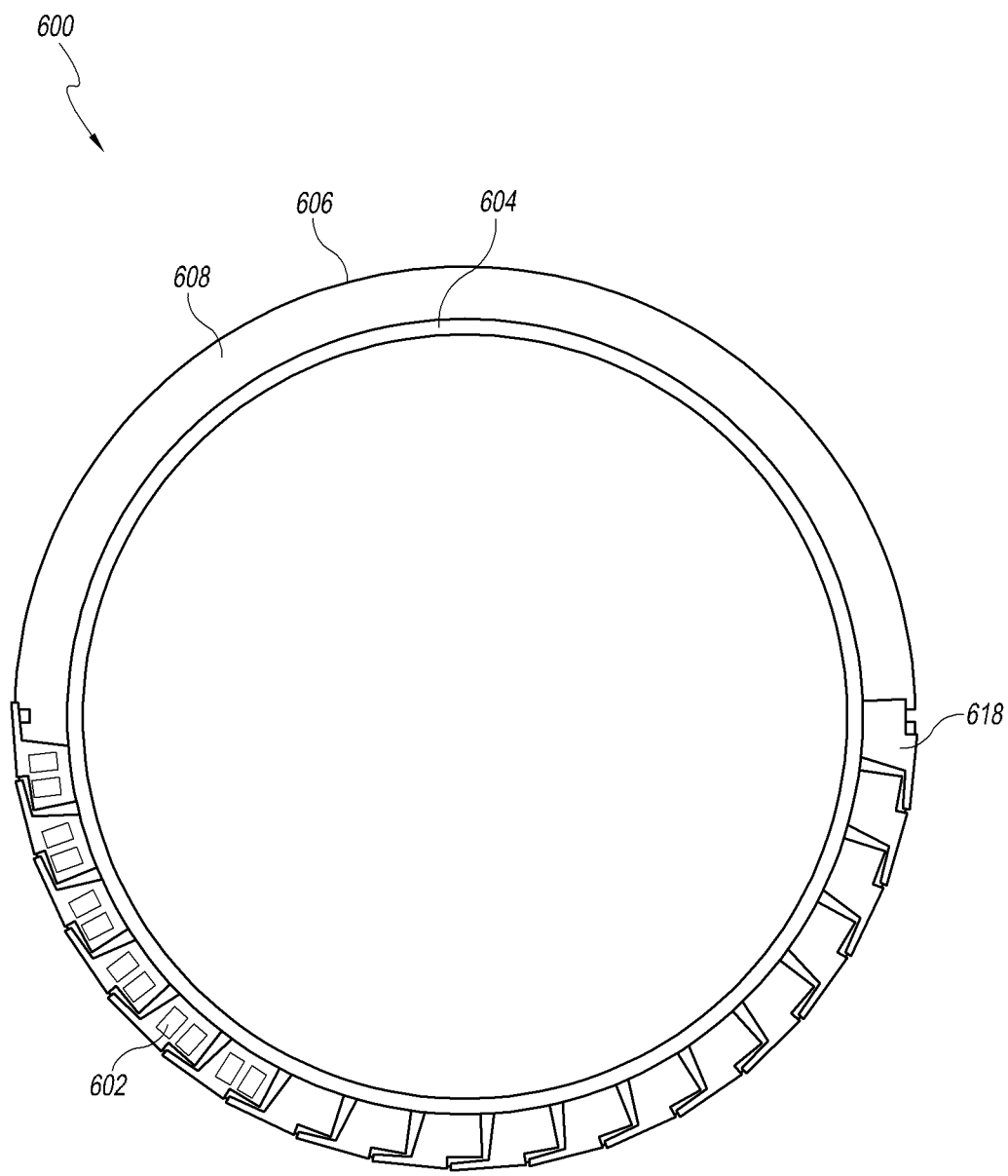
FIGS. 15A-15C schematically illustrate an example TE assembly having a plurality of Z-shape shunts in accordance with certain embodiments herein.
Figure 15B:
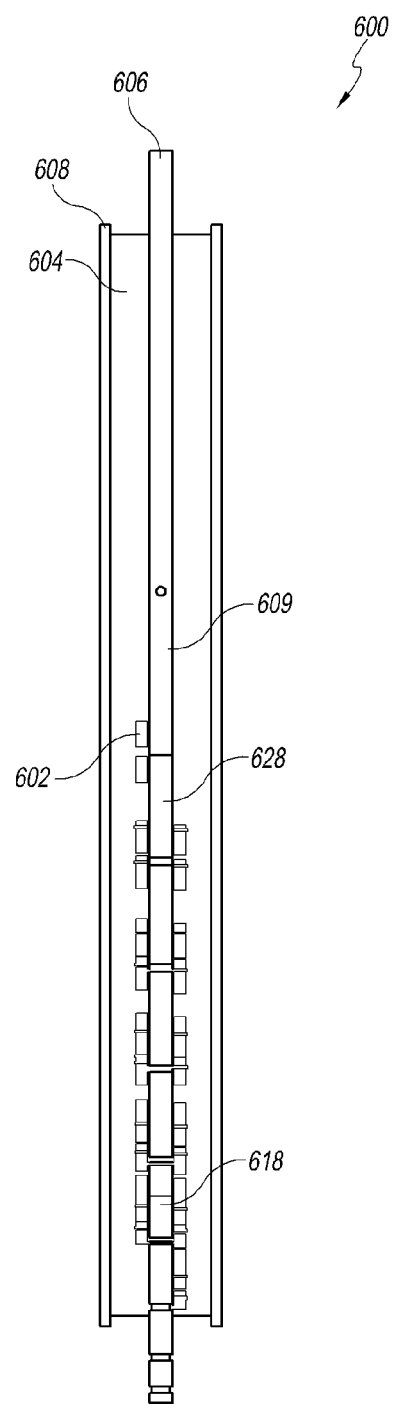
Figure 15C:
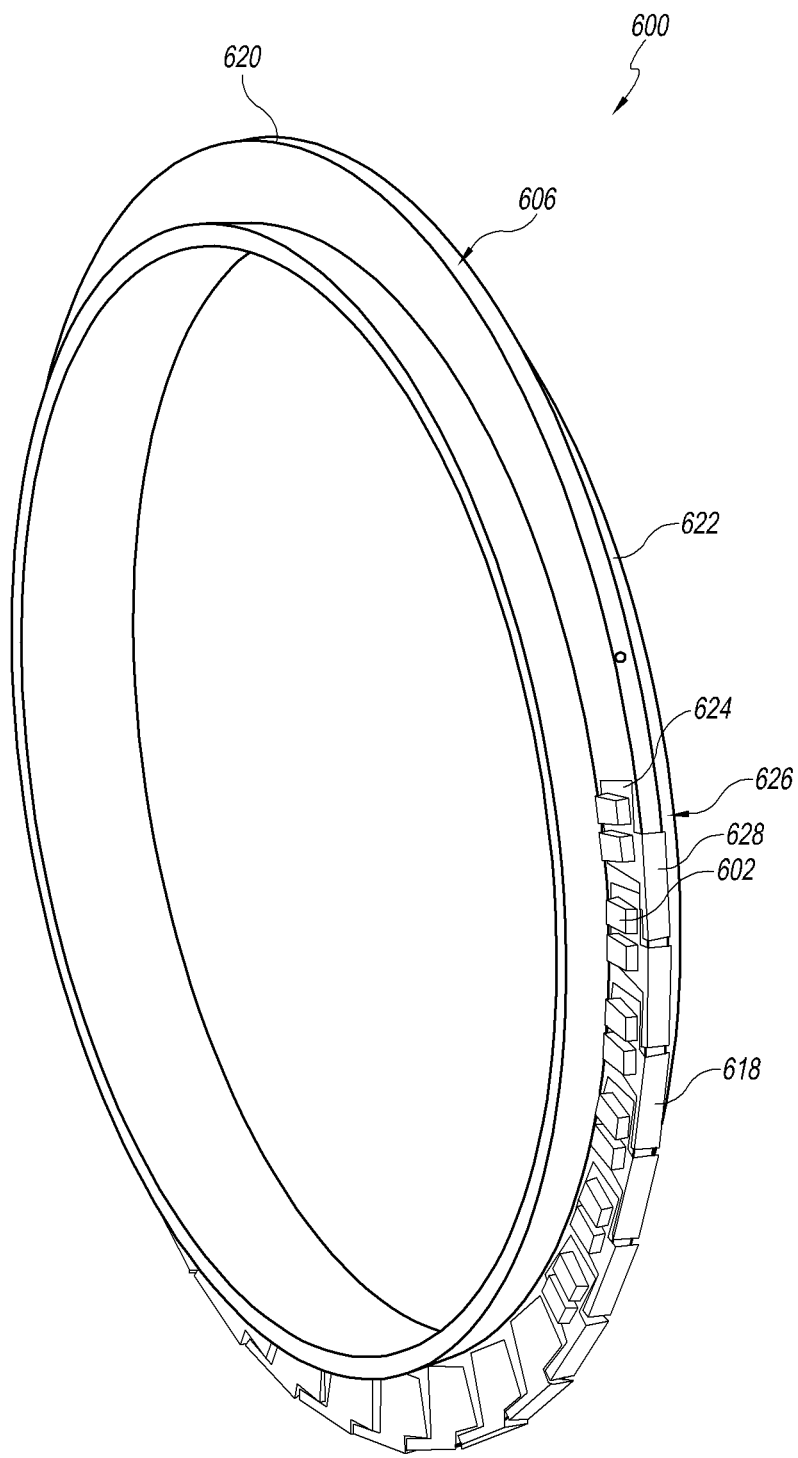

In some embodiments, one or more shunts of the plurality of shunts 618 extend over the at least one second portion 606 from a first surface 620 to a second surface 622 of the at least one second portion 606 as illustrated in FIGS. 15A-15C. The first surface 620 and second surface 622 can face opposite or generally opposite directions. In some embodiments, the one or more shunts 618 can comprise a first portion 624 in thermal communication with a first surface 620, a second portion 626 in thermal communication with a second surface 622, and a third portion 628 in thermal communication with the first and second portion 624, 626. The third portion 628 can extend over the at least one second portion 606 of the at least one first heat exchanger 608.

Figure 16A:
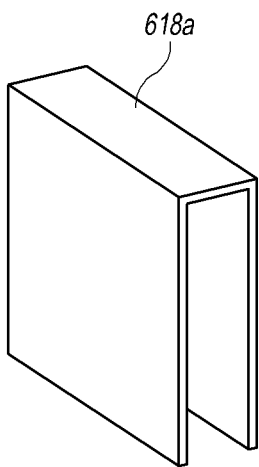
FIG. 16A schematically illustrates an example U-shape shunt in accordance with certain embodiments herein FIG. 16B schematically illustrates an example Z-shape shunt in accordance with certain embodiments herein FIG. 17 schematically illustrates one example electrical connection of a TE assembly in accordance with certain embodiments herein.
Figure 16B:
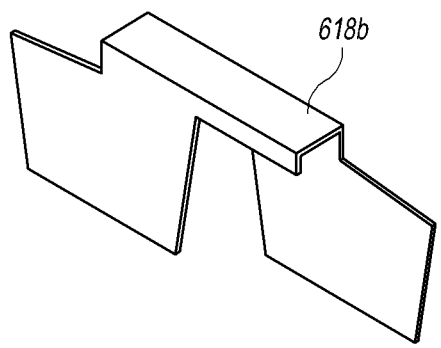

As illustrated in FIGS. 16A-16B, the plurality of shunts 618 can have, but is not limited to, a U-shape 618a or Z-shape 618b in some embodiments. The electrically insulating coating or layer can be deposited either on the surface of the heat exchanger 608 or on the inside surface of the U or Z shunt to provide for electrical separation between the shunt 618 and the heat exchanger 608.

In some embodiments, one or more shunts 618 can apply a compressive force on the at least one second portion 606 between the first surface 620 and second surface 622. As discussed above, an electrically insulating layer can be coated on one or more shunts 618. The shunt 618 can be used as a clip to provide good thermal contact at the interface between the shunt 618 and the heat exchanger 608. The geometry of a shunt 618 can be designed in such way as to enhance this action or contact (e.g., by designing a shunt 618 with thicker walls at the root or base then at the tip or top of the shunt 618).

Figure 17:
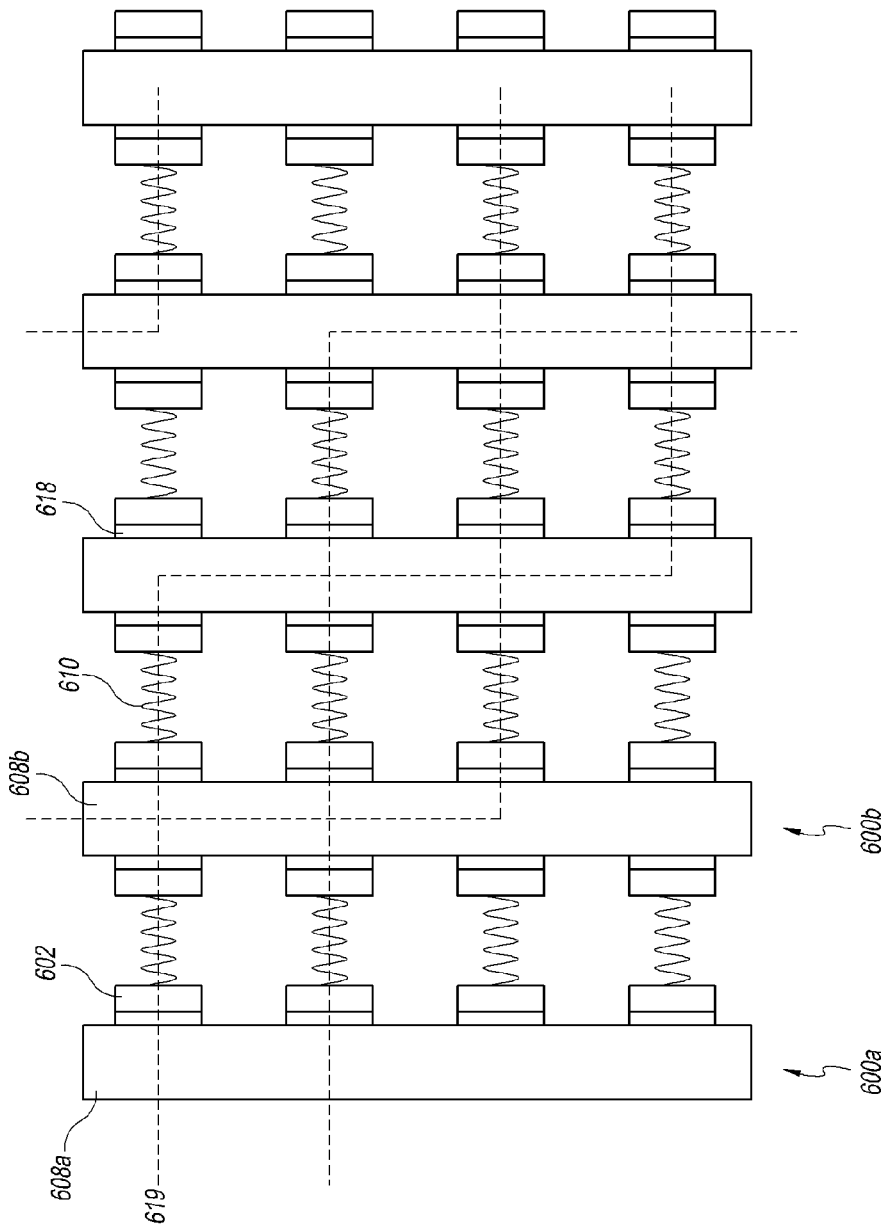

In some embodiments, as shown in FIG. 14B, the at least one second heat exchanger 610 is in electrical communication with the first plurality of TE elements 602 such that the plurality of shunts 618 and the at least one second heat exchanger 610 connect at least some of the plurality of TE elements 602 to be in series electrical communication with one another. In some embodiments, the electrical path of current flowing through the first plurality of TE elements 602 is generally parallel to the at least one second portion of the at least one first heat exchanger 606. In some embodiments, the electrical path of current flowing through the first plurality of TE elements 602 is generally non-parallel to the at least one second portion of the at least one first heat exchanger 606. As shown in FIGS. 15A-15C, for example, TE elements 602 are placed on the shunts 618 and each shunt 618 has p-type elements on one side and n-type elements on the other side. Once the TE assemblies 600 are stacked together or adjacent to each other, the electrical path is generally in the axial direction. Adjacent rows are then connected in parallel or series or combinations of parallel and series. For example, a possible electrical connection is schematically illustrated in FIG. 17 for Z-shaped shunts 618b. The p- and n-type TE elements 602 are in series electrical communication with one another, and the current path 619 is generally axial through the TE elements 602 and each shunt 618 shifts the current path 619 in a step-wise fashion around the heat exchangers 608, 610.

In some embodiments, a TE system 650 can comprise a plurality of TE assemblies 600 as discussed above, wherein adjacent TE assemblies 600 (e.g., 600a, 600b) are parallel or generally parallel to one another. The TE system 650 can further comprise a second plurality of TE elements 602b mechanically coupled to and in thermal communication with the at least one second heat exchanger 610 of a first TE assembly 600a and mechanically coupled to and in thermal communication with at least one second portion of a second TE assembly 600b adjacent to the first TE assembly 600a. In some embodiments, the first plurality of TE elements 602a and the second plurality of TE elements 602b are in parallel communication with one another.

In some embodiments, an electrical path of current flowing through the TE system 650 is between at least one electrically insulating layer of the first TE assembly 600a and at least one electrically insulating layer of the second TE assembly 600b. In certain embodiments, an electrical path of current flowing through the TE system 650 extends over at least one of the at least one electrically insulating layer of the first TE assembly 600a and at least one electrically insulating layer of the second TE assembly 600b.

Discussion of the various embodiments herein has generally followed the embodiments schematically illustrated in the figures. However, it is contemplated that the particular features, structures, or characteristics of any embodiments discussed herein may be combined in any suitable manner in one or more separate embodiments not expressly illustrated or described. In many cases, structures that are described or illustrated as unitary or contiguous can be separated while still performing the function(s) of the unitary structure. In many instances, structures that are described or illustrated as separate can be joined or combined while still performing the function(s) of the separated structures.

Various embodiments have been described above. Although the invention has been described with reference to these specific embodiments, the descriptions are intended to be illustrative and are not intended to be limiting. Various modifications and applications may occur to those skilled in the art without departing from the true spirit and scope of the invention as defined in the appended claims.

What is claimed is:

1. A thermoelectric assembly configured to be in thermal communication with a generally tubular first fluid conduit configured to allow a first fluid to flow through the first fluid conduit along a first direction, the thermoelectric assembly extending at least partially around a perimeter of the first fluid conduit, the thermoelectric assembly comprising:
   a plurality of thermoelectric elements;
   at least one shunt comprising a first portion and a second portion, the first portion in thermal communication with and mechanically coupled to the plurality of thermoelectric elements, the second portion in thermal communication with and mechanically coupled to the first portion and having a curved surface configured to be in thermal communication with the first fluid conduit;
   at least one electrically insulating element configured to electrically isolate the plurality of thermoelectric elements from the at least one shunt;
   at least one hole or recess in the first portion of the at least one shunt; and
   at least one insert at least partially within the at least one hole or recess and in thermal communication and in electrical communication with the plurality of thermoelectric elements,
   wherein the at least one electrically insulating element comprises at least one electrically insulating layer between the at least one insert and the first portion of the at least one shunt.

2. The thermoelectric assembly of claim 1, wherein the at least one electrically insulating layer comprises at least one of the group consisting of: a dielectric coating on an inner surface of the at least one hole or recess, a dielectric coating on the at least one insert, a dielectric ring, paste, adhesive, tape, and a flexible membrane.

3. The thermoelectric assembly of claim 1, wherein the at least one electrically insulating layer comprises one or more materials selected from the group consisting of: aluminum oxide, diamond, nitrides, cuprites, ceria, zirconia, or aluminates.

4. The thermoelectric assembly of claim 1, wherein the plurality of thermoelectric elements comprises at least one first thermoelectric element having a first doping type and at least one second thermoelectric element having a second doping type different from the first doping type, wherein the at least one insert is in electrical communication with the at least one first thermoelectric element and the at least one second thermoelectric element, and is between the at least one first thermoelectric element and the at least one second thermoelectric element.

5. The thermoelectric assembly of claim 4, wherein the at least one insert is in thermal communication with the at least one shunt and with the at least one first thermoelectric element and the at least one second thermoelectric element.

6. The thermoelectric assembly of claim 5, wherein the at least one insert comprises at least one plate configured to fit within the at least one hole or recess.

7. The thermoelectric assembly of claim 4, wherein the at least one insert has a coefficient of thermal expansion higher than a coefficient of thermal expansion of the at least one hunt.

8. The thermoelectric assembly of claim 4, wherein the at least one insert has a coefficient of thermal expansion lower than a coefficient of thermal expansion of the at least one shunt.

9. The thermoelectric assembly of claim 4, wherein the at least one insert has a coefficient of thermal conductivity higher than a coefficient of thermal conductivity of the at least one shunt.

* * * * *

UNITED STATES PATENT AND TRADEMARK OFFICE
CERTIFICATE OF CORRECTION

| | | |
|---|---|---|
| PATENT NO. | : 9,006,557 B2 | Page 1 of 1 |
| APPLICATION NO. | : 13/489192 | |
| DATED | : April 14, 2015 | |
| INVENTOR(S) | : John LaGrandeur | |

It is certified that error appears in the above-identified patent and that said Letters Patent is hereby corrected as shown below:

Title Page

In column 2 (page 1, item 56) at line 16, Under Other Publications, change "11-16I." to --11-161.--.

In column 2 (page 4, item 56) at line 49, Under Other Publications, change "Thermodynamics," to --Thermoelectrics,--.

In column 2 (page 4, item 56) at line 51, Under Other Publications, change "Multicopule" to --Multicouple--.

Claims

In column 24 at line 25, In Claim 7, change "hunt" to --shunt--.

Signed and Sealed this
Fifth Day of January, 2016

Michelle K. Lee
*Director of the United States Patent and Trademark Office*